United States Patent
Cideciyan et al.

(10) Patent No.: US 10,418,062 B2
(45) Date of Patent: Sep. 17, 2019

(54) EFFICIENT REWRITE USING LARGER CODEWORD SIZES

(71) Applicant: International Business Machines Corporation, Armonk, NY (US)

(72) Inventors: Roy D. Cideciyan, Rueschlikon (CH); Simeon Furrer, Altdorf (CH); Mark A. Lantz, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 15/847,774

(22) Filed: Dec. 19, 2017

(65) Prior Publication Data
US 2019/0189157 A1    Jun. 20, 2019

(51) Int. Cl.
*G11B 20/18* (2006.01)
*H03M 13/15* (2006.01)
(Continued)

(52) U.S. Cl.
CPC ...... *G11B 20/1833* (2013.01); *G11B 5/00813* (2013.01); *H03M 13/1515* (2013.01); *H03M 13/2792* (2013.01); *G11B 2020/184* (2013.01)

(58) Field of Classification Search
CPC ............ G11B 20/1833; G11B 5/00813; G11B 2020/184; H03M 13/2792; H03M 13/1515
See application file for complete search history.

(56) References Cited

U.S. PATENT DOCUMENTS

| 6,539,514 B1 * | 3/2003 | Bartlett | G11B 5/00826 |
| | | | 360/48 |
| 7,876,516 B2 * | 1/2011 | Cideciyan | G11B 20/1201 |
| | | | 360/40 |

(Continued)

FOREIGN PATENT DOCUMENTS

| CN | 102265346 A | 11/2011 |
| CN | 102272841 A | 12/2011 |
| CN | 106020716 A | 10/2016 |

OTHER PUBLICATIONS

J. M. Howell, "Certification of optical data storage tape-performance improvement from direct read after write," International Conference on Storage and Recording Systems, 1994., Keele, UK, 1994, pp. 92-97.*

(Continued)

*Primary Examiner* — Cynthia Britt
(74) *Attorney, Agent, or Firm* — Zilka-Kotab, P.C.

(57) ABSTRACT

In one embodiment, a method includes writing a data set to a sequential access medium. The method also includes reading the data set immediately after being written to the sequential access medium in a read-while-write process to identify one or more faulty encoded data blocks, each of the one or more faulty encoded data blocks including at least one faulty codeword having symbols at least 10 bits in size. Moreover, the method includes rewriting a first of the one or more faulty encoded data blocks within a first encoded data block set to a particular logical track in the rewrite area of the sequential access medium selected from a predetermined subset of logical tracks. The predetermined subset of logical tracks includes D1+D2+1 logical tracks. Only one faulty encoded data block from a particular sub data set is rewritten in a single encoded data block set in the rewrite area.

25 Claims, 24 Drawing Sheets

(51) Int. Cl.
  *H03M 13/27* (2006.01)
  *G11B 5/008* (2006.01)

(56) References Cited

U.S. PATENT DOCUMENTS

| | | | |
|---|---|---|---|
| 8,259,405 B2 | 9/2012 | Cideciyan et al. | |
| 8,495,470 B2 | 7/2013 | Cideciyan et al. | |
| 9,251,846 B2 | 2/2016 | Cideciyan et al. | |
| 9,548,760 B2 | 1/2017 | Cideciyan et al. | |
| 9,601,160 B2 * | 3/2017 | Bentley | G11B 20/18 |
| 2003/0030932 A1 * | 2/2003 | Sved | G11B 5/00813 |
| | | | 360/53 |
| 2005/0262400 A1 * | 11/2005 | Nadeau | G11B 5/09 |
| | | | 714/42 |
| 2010/0177422 A1 | 7/2010 | Cideciyan et al. | |
| 2012/0014013 A1 | 1/2012 | Bandic et al. | |
| 2012/0036318 A1 | 2/2012 | Cideciyan et al. | |

OTHER PUBLICATIONS

International Search Report and Written Opinion from PCT Application No. PCT/IB2018/059607, dated Mar. 20, 2019.
Hitachi Corporation, "Optimal interleaving for generalized concatenation," IP.com, IPCOM000146296D, Feb. 9, 2007, pp. 1-13.
Guillouard, S., "Parallel Stack Decoding for MIMO Schemes, " IP.com, IPCOM000185647D, Jul. 30, 2009, pp. 1-7.
Yu et al., "Decoding of Interleaved Reed-Solomon Codes via Simultaneous Partial Inverses," ISIT Conference & Symposium, 2015, pp. 2396-2400.
Cideciyan et al., U.S. Appl. No. 16/450,814, filed Jun. 24, 2019.

* cited by examiner

Flexible Rewrite Table
(for M=32, S=64, R=15, D1=1, D2=1)

| EDB Set (c) | Track Number (t) | | | | | | | | |
|---|---|---|---|---|---|---|---|---|---|
| | 0 | 1 | 2 | 3 | 4 | 5 | ... | 30 | 31 |
| 0 | 62,63,0, 1,2,3 | 0,1,2, 3,4,5 | 2,3,4, 5,6,7 | 4,5,6, 7,8,9 | 6,7,8, 9,10,11 | 8,9,10, 11,12,13 | ... | 58,59,60, 61,62,63 | 60,61,62, 63,0,1 |
| 1 | 32,33,34, 35,36,37 | 34,35,36, 37,38,39 | 36,37,38, 39,40,41 | 38,39,40, 41,42,43 | 40,41,42, 43,44,45 | 42,43,44, 45,46,47 | ... | 28,29,30, 31,32,33 | 30,31,32, 33,34,35 |
| 2 | 2,3,4, 5,6,7 | 4,5,6, 7,8,9 | 6,7,8, 9,10,11 | 8,9,10, 11,12,13 | 10,11,12, 13,14,15 | 12,13,14, 15,16,17 | ... | 62,63,0, 1,2,3 | 0,1,2, 3,4,5 |
| 3 | 36,37,38, 39,40,41 | 38,39,40, 41,42,43 | 40,41,42, 43,44,45 | 42,43,44, 45,46,47 | 44,45,46, 47,48,49 | 46,47,48, 49,50,51 | ... | 32,33,34, 35,36,37 | 34,35,36, 37,38,39 |
| 4 | 6,7,8, 9,10,11 | 8,9,10, 11,12,13 | 10,11,12, 13,14,15 | 12,13,14, 15,16,17 | 14,15,16, 17,18,19 | 16,17,18, 19,20,21 | ... | 2,3,4, 5,6,7 | 4,5,6, 7,8,9 |
| ... | ... | ... | ... | ... | ... | ... | | ... | ... |

FIG. 12

EFFICIENT REWRITE USING LARGER CODEWORD SIZES

BACKGROUND

The present invention relates to storing data to sequential storage media, and more particularly, to improved data storage utilizing more efficient rewrites having larger codeword sizes.

Currently-used linear tape drives which are used to store data sequentially apply product codes for byte-oriented error-correction coding (ECC) to the data prior to storing the data to the tape. These product codes contain two Reed-Solomon (RS) component codes consisting of a C1 row code and a C2 column code. Relatively long (about 1 kB) longitudinal interleaved error correction codewords, also known as codeword interleaves (CWI), are written on tracks of the magnetic medium (e.g., magnetic tape tracks). In current tape drive architectures, CWIs consist of four byte-interleaved RS codewords. During read-while-write, CWIs in a data set (DS) that includes more than a threshold number of errors are rewritten after the writing of the DS that has too many errors therein has been completed. Two CWI sets correspond to a codeword object (CO) set, which represents the minimum amount of data that can be written, or rewritten, on tape using current methodologies. This operating point is selected such that at the beginning of a tape drive's lifetime, the average number of rewritten CWI sets per DS is limited to about a 1% rewrite rate, which corresponds to two rewritten CWI sets per DS. The rewrite rate of 1% is currently reached when a byte error rate at the C1 decoder input is in a range of about $1\times10^{-4}$ to $1\times10^{-3}$.

It is possible to operate at a much lower signal-to-noise ratio (SNR) that enables areal density scaling while maintaining a user bit error rate (BER) of $1\times10^{-20}$ through the use of iterative decoding. However, with currently implemented C1 codes used in conjunction with a conventional rewrite strategy, reducing the SNR would result in a loss of capacity because excess rewrites would be performed during read-while-write processing due to a high C1 error rate that results from the C1 code being used.

Accordingly, improvements are needed to the rewrite strategy to take advantage of all the potential gain of iterative decoding. Specifically, it is desirable to operate the channel at lower signal-to-noise ratio (SNR) values by increasing the symbol error rate at which 1% rewrite rate is achieved by about one order. In other words, we would like the symbol error rate at the C1 decoder input corresponding to 1% rewrite rate to be a number in the range of 1e-3 to 1e-2. Furthermore, currently codewords in CWIs have small error correction capability. They can correct 5 to 6 bytes. This limits the flexibility in the choice of the rewrite error threshold. CWIs with C1 codewords that contain 4 or more errors are rewritten. It would be beneficial to be able to select the rewrite error threshold from a much larger range of numbers. Finally, it is desirable, to increase the rewrite efficiency by minimizing the number of CWI Sets that needs to be rewritten. This invention provides a solution to all these problems.

SUMMARY

In one embodiment, a system includes a magnetic head having a plurality of write transducers numbering at least M and a plurality of read transducers numbering at least M, each read transducer being configured to read data from a sequential access medium after being written thereto by a corresponding write transducer. The system also includes a controller and logic integrated with and/or executable by the controller. The logic is configured to write, using the plurality of M write transducers, a data set to a sequential access medium. The data set includes a number of sub data sets of fixed size, each sub data set including a plurality of encoded data blocks that include codewords in an interleaved or non-interleaved arrangement. Each codeword includes a predetermined number of symbols having a size of at least 8 bits for each symbol. The logic is also configured to read, using the plurality of M read transducers, the data set immediately after being written to the sequential access medium in a read-while-write process to identify one or more faulty encoded data blocks, each of the one or more faulty encoded data blocks including at least one faulty codeword. In addition, the logic is configured to select a particular logical track from a predetermined subset of logical tracks in a rewrite area of the sequential access medium to rewrite the faulty encoded data blocks, the rewrite area being positioned subsequent to a position of the data set first written on the sequential access medium. The predetermined subset of logical tracks includes D1+D2+1 logical tracks, with 0<D1+D2<M/4. The logic is also configured to rewrite a first of the one or more faulty encoded data blocks within a first encoded data block set to the particular logical track in the rewrite area of the sequential access medium, with only one faulty encoded data block from a particular sub data set being rewritten in a single encoded data block set in the rewrite area.

In another embodiment, a method includes writing, using a plurality of at least M write transducers of a magnetic head, a data set to a sequential access medium. The data set includes a number of sub data sets of fixed size, each sub data set including a plurality of encoded data blocks that comprise codewords in an interleaved or non-interleaved arrangement. Each codeword includes a predetermined number of symbols having a size of at least 8 bits for each symbol. The method also includes reading, using a plurality of at least M read transducers of the magnetic head, the data set immediately after being written to the sequential access medium in a read-while-write process to identify one or more faulty encoded data blocks, each of the one or more faulty encoded data blocks including at least one faulty codeword. In addition, the method includes selecting a particular logical track from a predetermined subset of logical tracks in a rewrite area of the sequential access medium to rewrite the faulty encoded data blocks, the rewrite area being positioned subsequent to a position of the data set first written on the sequential access medium. The predetermined subset of logical tracks includes D1+D2+1 logical tracks, with 0<D1+D2<M/4. Moreover, the method includes rewriting a first of the one or more faulty encoded data blocks within a first encoded data block set to the particular logical track in the rewrite area of the sequential access medium. Only one faulty encoded data block from a particular sub data set is rewritten in a single encoded data block set in the rewrite area.

In accordance with another embodiment, a computer program product includes a computer readable storage medium having program instructions embodied therewith. The embodied program instructions are executable by a processor to cause the processor to write, by the processor using a plurality of at least M write transducers of a magnetic head, a data set to a sequential access medium. The data set includes a number of sub data sets of fixed size, each sub data set including a plurality of encoded data blocks that include codewords in an interleaved or non-interleaved arrangement. Each codeword includes a predetermined number of symbols having a size of at least 8 bits for each symbol. The embodied program instructions are also executable by the processor to cause the processor to read, by the processor using a plurality of at least M read transducers of the magnetic head, the data set immediately after being written to the sequential access medium in a read-while-write process to identify one or more faulty encoded data blocks, each of the one or more faulty encoded data blocks including at least one faulty codeword. In addition, the embodied program instructions are executable by the processor to cause the processor to select, by the processor, a particular logical track from a predetermined subset of logical tracks in a rewrite area of the sequential access medium to rewrite the faulty encoded data blocks, the rewrite area being positioned subsequent to a position of the data set first written on the sequential access medium. The predetermined subset of logical tracks includes D1+D2+1 logical tracks, with 0<D1+D2<M/4. Moreover, the embodied program instructions are executable by the processor to cause the processor to rewrite, by the processor, a first of the one or more faulty encoded data blocks within a first encoded data block set to the particular logical track in the rewrite area of the sequential access medium. Only one faulty encoded data block from a particular sub data set is rewritten in a single encoded data block set in the rewrite area.

In another embodiment, a method includes writing, using a plurality of write transducers of a magnetic head, a data set to a sequential access medium, the data set including a number of sub data sets of fixed size, each sub data set including a plurality of encoded data blocks that include codewords in an interleaved arrangement. Also, each codeword includes a predetermined number of symbols. The method also includes reading, using a plurality of read transducers of the magnetic head, the data set immediately after being written to the sequential access medium in a read-while-write process to identify one or more faulty encoded data blocks, each of the one or more faulty encoded data blocks including at least one faulty codeword. Also, the method includes decoding the data set read from the sequential access medium to determine the one or more faulty encoded data blocks, where an encoded data block is determined to be faulty in response to detection of a threshold number of errors therein after the encoded data block is decoded. In addition, the method includes selecting one or more logical tracks from one or more unique predetermined subsets of logical tracks in a rewrite area of the sequential access medium to rewrite the one or more faulty encoded data blocks, the rewrite area being positioned subsequent to a position of the data set first written on the sequential access medium. Each of the predetermined subsets of logical tracks includes three logical tracks. Moreover, the method includes rewriting the one or more faulty encoded data blocks within one or more encoded data block sets to the one or more logical tracks in the rewrite area of the sequential access medium. Only one faulty encoded data block from a particular sub data set is rewritten in a single encoded data block set in the rewrite area, with each encoded data block being written to the sequential access medium as two symbol-interleaved Reed-Solomon RS(384,364) C1 codewords over a Galois Field GF(1024).

In yet another embodiment, a method includes writing, using a plurality of write transducers of a magnetic head, a data set to a sequential access medium, the data set including a number of sub data sets of fixed size, each sub data set including a plurality of encoded data blocks that include codewords in an interleaved arrangement. Also, each codeword includes a predetermined number of symbols. The method also includes reading, using a plurality of read transducers of the magnetic head, the data set immediately after being written to the sequential access medium in a read-while-write process to identify one or more faulty encoded data blocks, each of the one or more faulty encoded data blocks including at least one faulty codeword. Also, the method includes decoding the data set read from the sequential access medium to determine the one or more faulty encoded data blocks, where an encoded data block is determined to be faulty in response to detection of a threshold number of errors therein after the encoded data block is decoded. In addition, the method includes selecting one or more logical tracks from one or more unique predetermined subsets of logical tracks in a rewrite area of the sequential access medium to rewrite the one or more faulty encoded data blocks, the rewrite area being positioned subsequent to a position of the data set first written on the sequential access medium. Each of the predetermined subsets of logical tracks includes five logical tracks. Moreover, the method includes rewriting the one or more faulty encoded data blocks within one or more encoded data block sets to the one or more logical tracks in the rewrite area of the sequential access medium. Only one faulty encoded data block from a particular sub data set is rewritten in a single encoded data block set in the rewrite area, with each encoded data block being written to the sequential access medium as Reed-Solomon RS(768,728) C1 codeword over a Galois Field GF(1024).

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 12 shows an exemplary flexible rewrite table.

DETAILED DESCRIPTION

Figure 1:
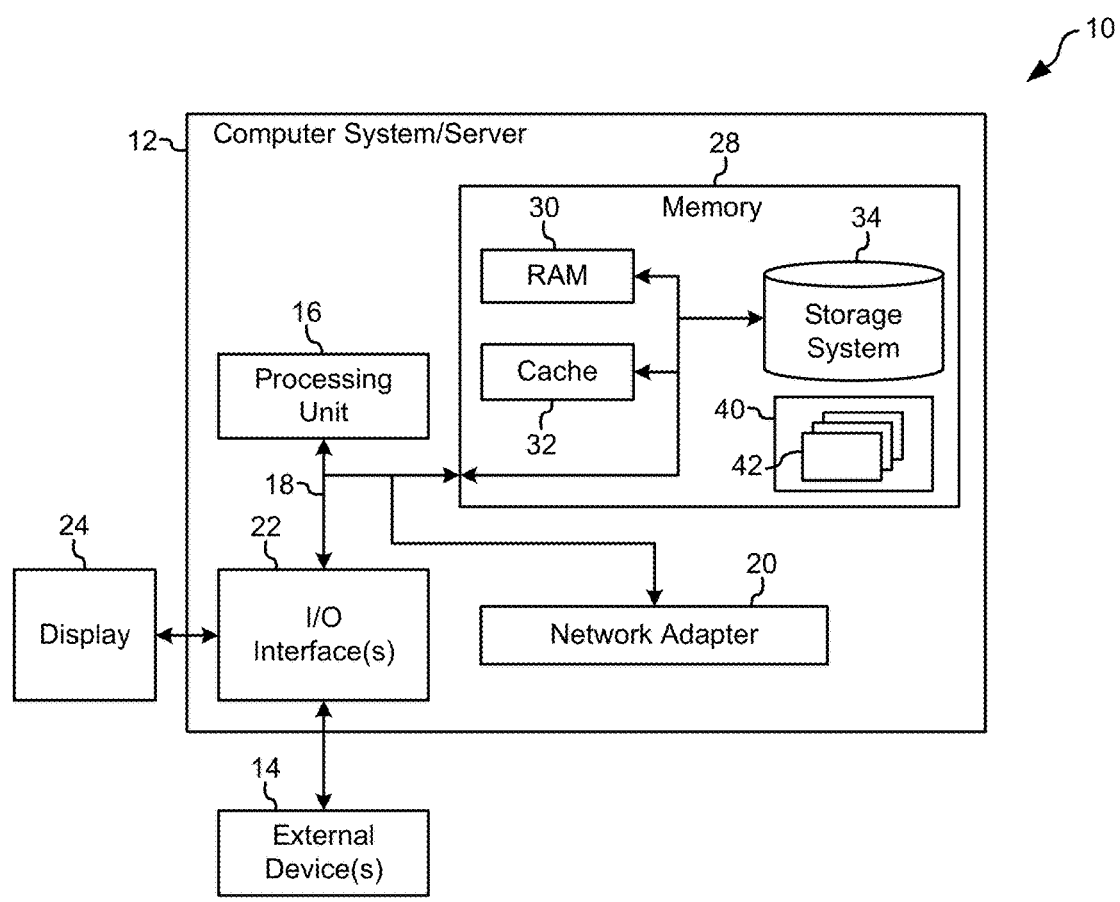
FIG. 1 illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "about" as used herein indicates the value preceded by the term "about," along with any values reasonably close to the value preceded by the term "about," as would be understood by one of skill in the art. When not indicated otherwise, the term "about" denotes the value preceded by the term "about"±10% of the value. For example, "about 10" indicates all values from and including 9.0 to 11.0.

The following description discloses several preferred embodiments of systems, methods, and computer program products for data rewrite on sequential data storage media that utilizes larger codeword sizes capable of providing more efficient rewriting.

In one general embodiment, a system includes a magnetic head having a plurality of write transducers numbering at least M and a plurality of read transducers numbering at least M, each read transducer being configured to read data from a sequential access medium after being written thereto by a corresponding write transducer. The system also includes a controller and logic integrated with and/or executable by the controller. The logic is configured to write, using the plurality of M write transducers, a data set to a sequential access medium. The data set includes a number of sub data sets of fixed size, each sub data set including a plurality of encoded data blocks that include codewords in an interleaved or non-interleaved arrangement. Each codeword includes a predetermined number of symbols having a size of at least 8 bits for each symbol. The logic is also configured to read, using the plurality of M read transducers, the data set immediately after being written to the sequential access medium in a read-while-write process to identify one or more faulty encoded data blocks, each of the one or more faulty encoded data blocks including at least one faulty codeword. In addition, the logic is configured to select a particular logical track from a predetermined subset of logical tracks in a rewrite area of the sequential access medium to rewrite the faulty encoded data blocks, the rewrite area being positioned subsequent to a position of the data set first written on the sequential access medium. The predetermined subset of logical tracks includes D1+D2+1 logical tracks, with 0<D1+D2<M/4. The logic is also configured to rewrite a first of the one or more faulty encoded data blocks within a first encoded data block set to the particular logical track in the rewrite area of the sequential access medium, with only one faulty encoded data block from a particular sub data set being rewritten in a single encoded data block set in the rewrite area.

In another general embodiment, a method includes writing, using a plurality of at least M write transducers of a magnetic head, a data set to a sequential access medium. The data set includes a number of sub data sets of fixed size, each sub data set including a plurality of encoded data blocks that comprise codewords in an interleaved or non-interleaved arrangement. Each codeword includes a predetermined number of symbols having a size of at least 8 bits for each symbol. The method also includes reading, using a plurality of at least M read transducers of the magnetic head, the data set immediately after being written to the sequential access medium in a read-while-write process to identify one or more faulty encoded data blocks, each of the one or more faulty encoded data blocks including at least one faulty codeword. In addition, the method includes selecting a particular logical track from a predetermined subset of logical tracks in a rewrite area of the sequential access medium to rewrite the faulty encoded data blocks, the rewrite area being positioned subsequent to a position of the data set first written on the sequential access medium. The predetermined subset of logical tracks includes D1+D2+1 logical tracks, with 0<D1+D2<M/4. Moreover, the method includes rewriting a first of the one or more faulty encoded data blocks within a first encoded data block set to the particular logical track in the rewrite area of the sequential access medium. Only one faulty encoded data block from a particular sub data set is rewritten in a single encoded data block set in the rewrite area.

In accordance with another general embodiment, a computer program product includes a computer readable storage medium having program instructions embodied therewith. The embodied program instructions are executable by a processor to cause the processor to write, by the processor using a plurality of at least M write transducers of a magnetic head, a data set to a sequential access medium. The data set includes a number of sub data sets of fixed size, each sub data set including a plurality of encoded data blocks that include codewords in an interleaved or non-interleaved arrangement. Each codeword includes a predetermined number of symbols having a size of at least 8 bits for each symbol. The embodied program instructions are also executable by the processor to cause the processor to read, by the processor using a plurality of at least M read transducers of the magnetic head, the data set immediately after being written to the sequential access medium in a read-while-write process to identify one or more faulty encoded data blocks, each of the one or more faulty encoded data blocks including at least one faulty codeword. In addition, the embodied program instructions are executable by the processor to cause the processor to select, by the processor, a particular logical track from a predetermined subset of logical tracks in a rewrite area of the sequential access medium to rewrite the faulty encoded data blocks, the rewrite area being positioned subsequent to a position of the data set first written on the sequential access medium. The predetermined subset of logical tracks includes D1+D2+1 logical tracks, with 0<D1+D2<M/4. Moreover, the embodied program instructions are executable by the processor to cause the processor to rewrite, by the processor, a first of the one or more faulty encoded data blocks within a first encoded data block set to the particular logical track in the rewrite area of the sequential access medium. Only one faulty encoded data block from a particular sub data set is rewritten in a single encoded data block set in the rewrite area.

In another general embodiment, a method includes writing, using a plurality of write transducers of a magnetic head, a data set to a sequential access medium, the data set including a number of sub data sets of fixed size, each sub data set including a plurality of encoded data blocks that include codewords in an interleaved arrangement. Also, each codeword includes a predetermined number of symbols. The method also includes reading, using a plurality of read transducers of the magnetic head, the data set immediately after being written to the sequential access medium in a read-while-write process to identify one or more faulty encoded data blocks, each of the one or more faulty encoded data blocks including at least one faulty codeword. Also, the method includes decoding the data set read from the sequential access medium to determine the one or more faulty encoded data blocks, where an encoded data block is determined to be faulty in response to detection of a threshold number of errors therein after the encoded data block is decoded. In addition, the method includes selecting one or more logical tracks from one or more unique predetermined subsets of logical tracks in a rewrite area of the sequential access medium to rewrite the one or more faulty encoded data blocks, the rewrite area being positioned subsequent to a position of the data set first written on the sequential access medium. Each of the predetermined subsets of logical tracks includes three logical tracks. Moreover, the method includes rewriting the one or more faulty encoded data blocks within one or more encoded data block sets to the one or more logical tracks in the rewrite area of the sequential access medium. Only one faulty encoded data block from a particular sub data set is rewritten in a single encoded data block set in the rewrite area, with each encoded data block being written to the sequential access medium as two symbol-interleaved Reed-Solomon RS(384,364) C1 codewords over a Galois Field GF(1024).

In yet another general embodiment, a method includes writing, using a plurality of write transducers of a magnetic head, a data set to a sequential access medium, the data set including a number of sub data sets of fixed size, each sub data set including a plurality of encoded data blocks that include codewords in an interleaved arrangement. Also, each codeword includes a predetermined number of symbols. The method also includes reading, using a plurality of read transducers of the magnetic head, the data set immediately after being written to the sequential access medium in a read-while-write process to identify one or more faulty encoded data blocks, each of the one or more faulty encoded data blocks including at least one faulty codeword. Also, the method includes decoding the data set read from the sequential access medium to determine the one or more faulty encoded data blocks, where an encoded data block is determined to be faulty in response to detection of a threshold number of errors therein after the encoded data block is decoded. In addition, the method includes selecting one or more logical tracks from one or more unique predetermined subsets of logical tracks in a rewrite area of the sequential access medium to rewrite the one or more faulty encoded data blocks, the rewrite area being positioned subsequent to a position of the data set first written on the sequential access medium. Each of the predetermined subsets of logical tracks includes five logical tracks. Moreover, the method includes rewriting the one or more faulty encoded data blocks within one or more encoded data block sets to the one or more logical tracks in the rewrite area of the sequential access medium. Only one faulty encoded data block from a particular sub data set is rewritten in a single encoded data block set in the rewrite area, with each encoded data block being written to the sequential access medium as Reed-Solomon RS(768,728) C1 codeword over a Galois Field GF(1024).

Referring now to FIG. 1, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in the network storage system 10 is shown in the form of a general-purpose computing device. The components of computer system/server 12 may include, but are not limited to, one or more processing units 16, a system memory 28, and a bus 18 that couples various system components including system memory 28 to processing unit(s) 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, redundant array of independent disks (RAID) systems, tape drives, and data archival storage systems, etc.

Figure 2A:
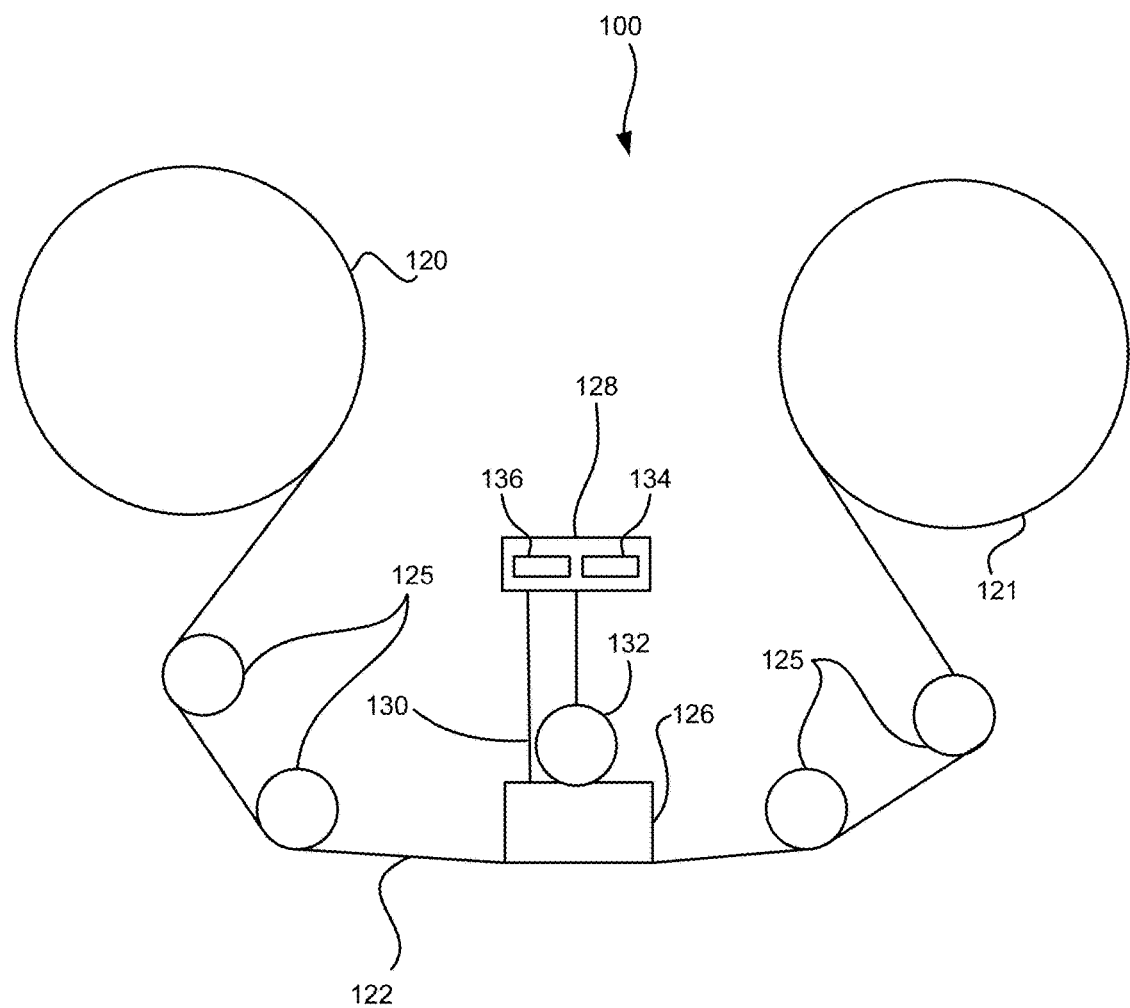
FIG. 2A illustrates a simplified tape drive of a tape-based data storage system, according to one embodiment.

FIG. 2A illustrates a simplified tape drive 100 of a tape-based data storage system, which may be employed in the context of the present invention. While one specific implementation of a tape drive is shown in FIG. 2A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the tape drive 100. The tape drive, such as that illustrated in FIG. 2A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the tape drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 2B:
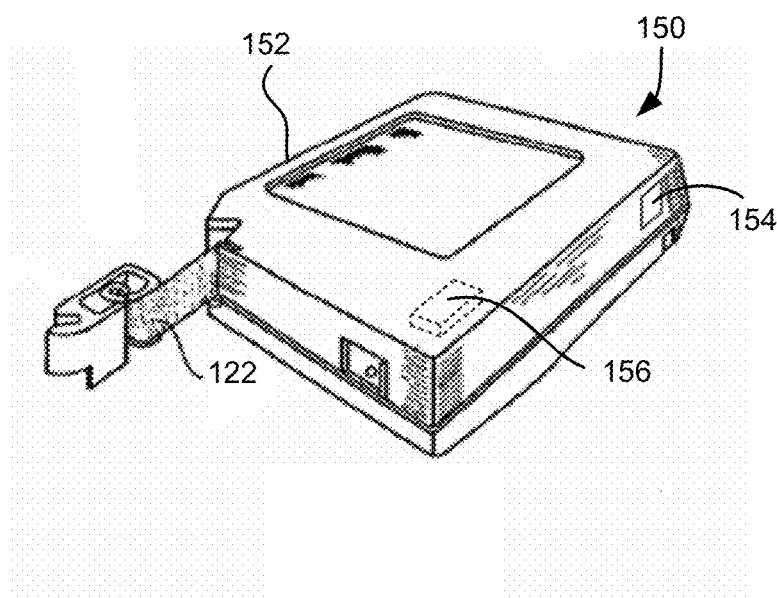
FIG. 2B is a schematic diagram of a tape cartridge according to one embodiment.

FIG. 2B illustrates an exemplary tape cartridge 150 according to one embodiment. Such tape cartridge 150 may be used with a system such as that shown in FIG. 2A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 2B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 3:
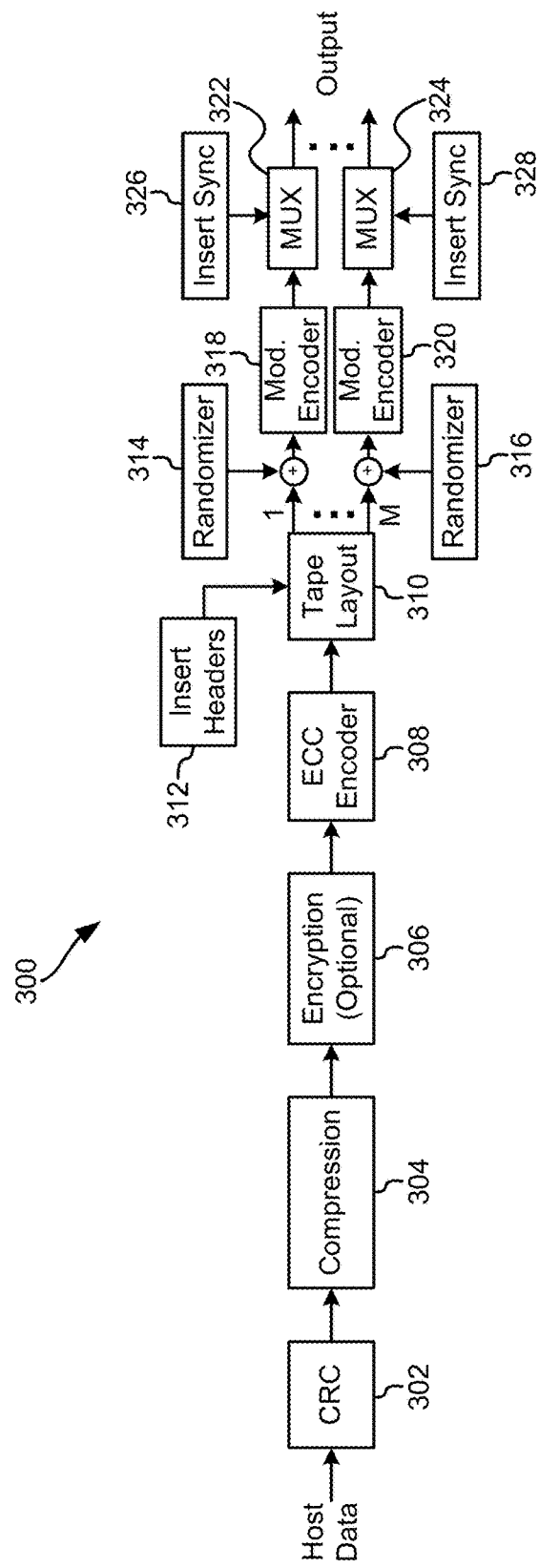
FIG. 3 illustrates a conceptual data flow in a tape drive in accordance with one embodiment.

FIG. 3 shows, in detailed form, a conceptual data flow 300 in a tape drive with M simultaneously written tracks via M write channels. The data flow 300 includes passing host data through a cyclic redundancy check (CRC) error detection encoder 302, a compression module 304, an optional encryption module 306, an error correction code (ECC) encoder 308 (which includes a C1 encoder and a C2 encoder, arranged as C1/C2, or C2/C1), and a tape layout module 310, according to one embodiment. The header insertion module 312 may be positioned as shown, feeding into the tape layout module 310, or may be positioned feeding into the ECC encoder 308, thereby allowing the headers to receive some amount of ECC encoding, in one embodiment. The tape layout module 310 splits the data into individual feeds for each channel 1, . . . , M to write to the tracks of the tape medium. The data flow 300 also includes scrambling the data (data randomization) 314, . . . , 316, modulation encoding 318, . . . , 320, synchronization insertion 326, . . . , 328, and multiplexing 322, . . . , 324 for each simultaneously written track 1, . . . , M.

In the following descriptions, most of these operations are not shown, in order to simplify descriptions. However, any of the descriptions herein may include additional operations not depicted, as would be understood by one of ordinary skill in the art upon reading the present descriptions. The number of tracks that may be written simultaneously depends on the tape drive being used, with the value of M ranging from 1 to 64 or more.

There are five types of overhead associated with data written on tape: error correction encoding at the ECC encoder 308, modulation encoding 318, . . . , 320, insertion of headers 312, insertion of synchronization patterns 326, . . . , 328, and rewriting of data following read-while-write. Approximately 79% format efficiency is achieved due to these primary forms of overhead excluding rewrite overhead, e.g., only 79 bits of data out of every 100 bits stored to tape correspond to user data, which is the data provided to the input of the ECC encoder 308. Moreover, a typical magnetic tape reserves about 3% of space for rewriting data.

Figure 4:
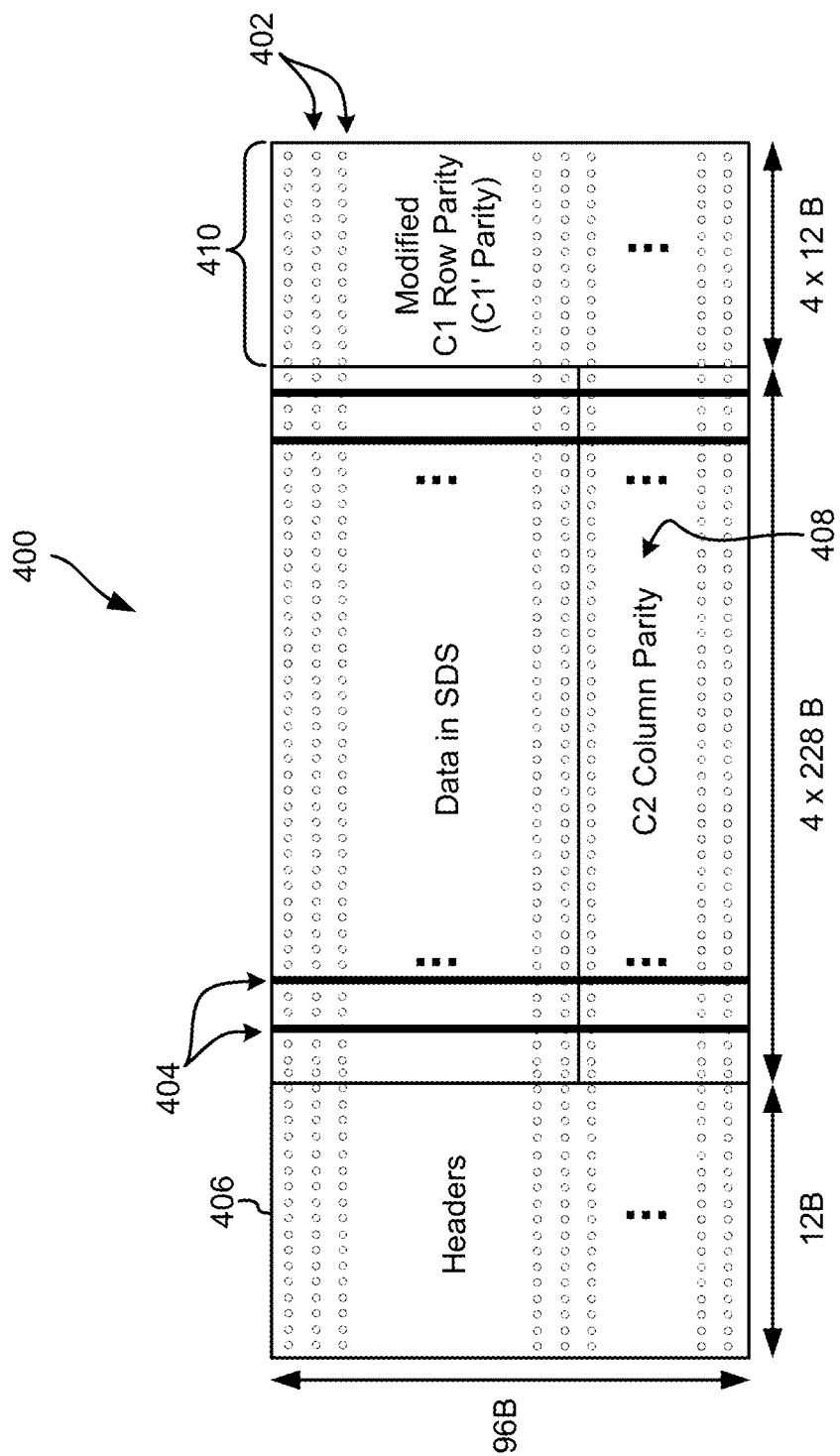
FIG. 4 shows a logical data array that may be used to organize data in a sub data set (SDS), according to one embodiment.

FIG. 4 shows a logical data array 400 that may be used to organize data in a sub data set (SDS), according to one embodiment. As shown, the data array includes a plurality of rows 402 and columns 404. Each row 402 in the data array 400 is a codeword interleave (CWI) that includes a plurality of C1 codewords. When the CWI includes four interleaved codewords, it is referred to as a CWI-4. The data in the SDS is protected by C1 encoding across each row 402 to produce C1 row parity (not shown as it is modified later to produce the data array 400), and by C2 encoding across each column 404 to produce C2 column parity 408.

As shown, the headers 406 for each row 402 may be encoded using a C1 encoding scheme by modifying the C1 parity (computed for the data in the row 402 only) to account for the headers 406 to produce C1' parity 410. In this embodiment, the headers 406 are protected by one-level ECC (C1' parity 410 only), whereas the data is protected by two-level ECC (C1' parity 410 and C2 parity 408).

Each data set includes multiple sub data sets and each sub data set may be represented by a logical two-dimensional array. Usually hundreds of headers are assigned to a single data set because each data set includes multiple SDSs and each row (which is typically a CWI) of a column-encoded SDS is assigned a header.

Currently-used linear tape drives simultaneously write and read up to 32 tracks to and/or from a magnetic tape medium. C1 row codewords of a product code are written in a byte-interleaved fashion onto individual tracks of the magnetic tape medium.

FIG. 4 illustrates an exemplary (240,228) C1 code with 12 bytes of parity applied to a product codeword. A different C1 code may be used in constructing the logical data array 400 in conjunction with the various embodiments described herein, as would be understood by one of skill in the art upon reading the present descriptions.

Figure 5:
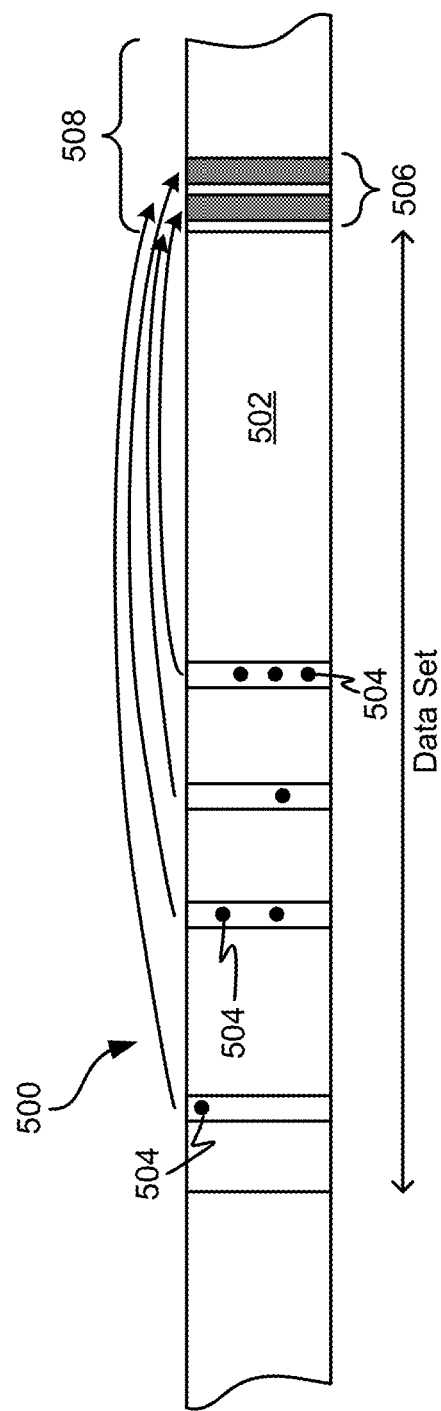
FIG. 5 shows a rewrite scheme according to one embodiment.

Now referring to FIG. 5, a rewrite scheme is shown according to one embodiment. In this rewrite scheme 500, in response to a data set 502 being written, all faulty data packets 504 (headerized CWIs or headerized encoded data blocks) detected during read-while-write are collected in a large pool 506 and rewritten at the end of the data set in a rewrite area 508. This rewrite scheme 500 increases rewrite efficiency and therefore reduces the size of the rewrite area 508 on tape as compared to conventional rewrite schemes.

Figure 6:
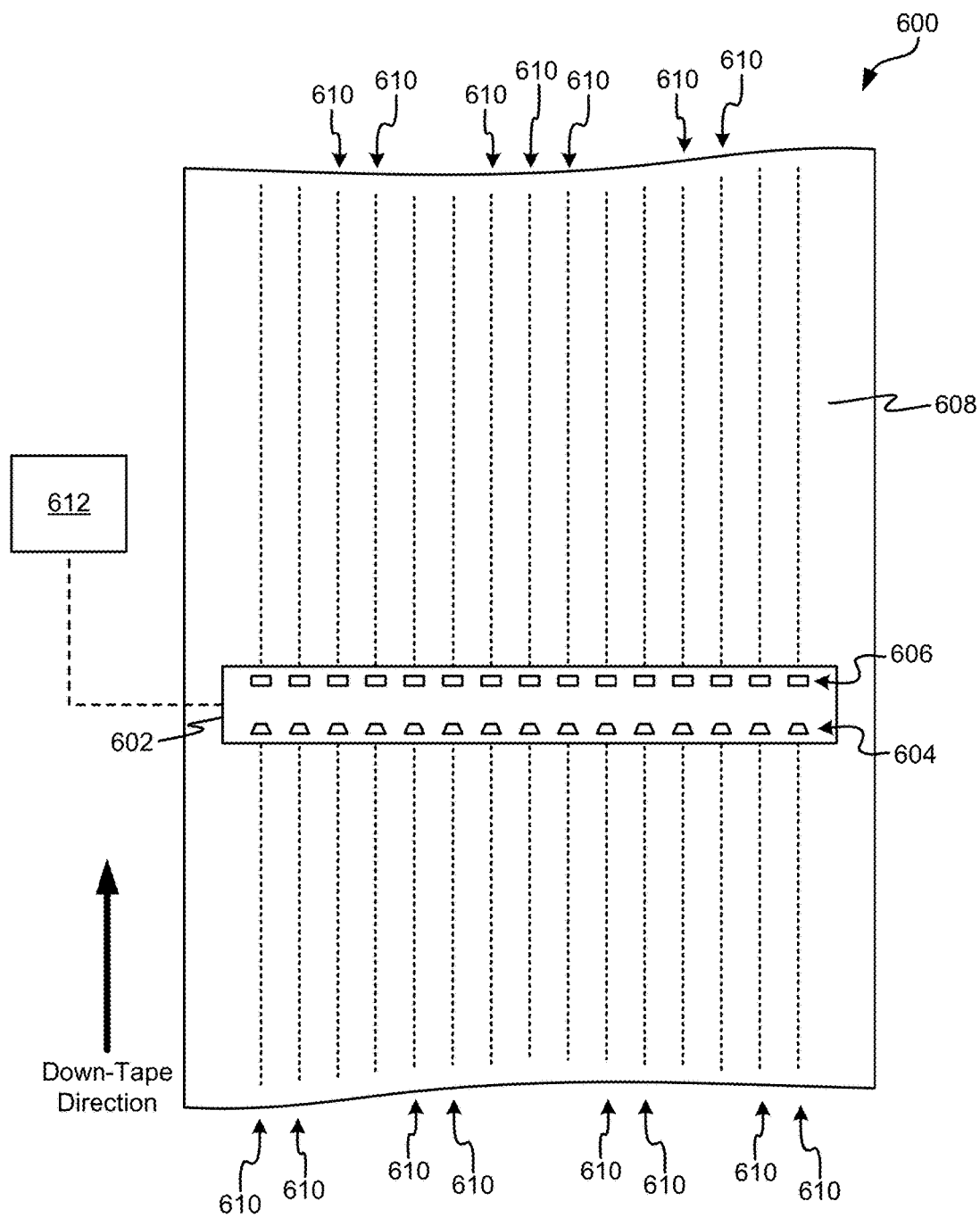
FIG. 6 shows a system for storing and reading data on a sequential access medium, according to one embodiment.

With reference to FIG. 6, a system 600 is shown according to one embodiment. The system 600 includes at least one magnetic head 602 that includes a plurality of write transducers 604 and a plurality of read transducers 606, with each read transducer 606 being positioned in a down-tape direction from a corresponding write transducer 604. Each read transducer 606 is configured to read data from one track of a magnetic tape medium 608 simultaneously with the other read transducers 606, thereby allowing a plurality of tracks 610 to be read simultaneously from the magnetic tape medium 608. The number of tracks 610 capable of being read simultaneously is equal to the number of read transducers 606 of the magnetic head 602. Of course, some read transducers 606 may be configured to read servo tracks for magnetic head alignment, and/or for other purposes, but for the sake of these descriptions, it is assumed that the read transducers 606 are each capable of reading data from the magnetic tape medium 608.

The system 600 also includes a hardware processing circuit 612 and logic integrated with and/or executable by the hardware processing circuit 612. The hardware processing circuit 612 may be a hardware processing unit and/or circuit, such as a central processing unit (CPU), an application specific integrated circuit (ASIC), a field programmable gate array (FPGA), etc., combinations thereof, or any other suitable computing or processing device known in the art. The logic may be implemented in software, hardware, or some combination thereof. In one embodiment, the logic is configured to cause the processing circuit 612 to write, using the plurality of M write transducers, a data set to a sequential access medium. The data set includes a number of sub data sets of fixed size, each sub data set including a plurality of encoded data blocks that include codewords in an interleaved or non-interleaved arrangement. Each codeword includes a predetermined number of symbols having a size of at least 8 bits for each symbol. The logic is also configured to cause the processing circuit 612 to read, using the plurality of M read transducers, the data set immediately after being written to the sequential access medium in a read-while-write process to identify one or more faulty encoded data blocks, each of the one or more faulty encoded data blocks including at least one faulty codeword. In addition, the logic is configured to cause the processing circuit 612 to select a particular logical track from a predetermined subset of logical tracks in a rewrite area of the sequential access medium to rewrite the faulty encoded data blocks, the rewrite area being positioned subsequent to a position of the data set first written on the sequential access medium. The predetermined subset of logical tracks includes $D1+D2+1$ logical tracks, with $0<D1+D2<M/4$. The logic is also configured to cause the processing circuit 612 to rewrite a first of the one or more faulty encoded data blocks within a first encoded data block set to the particular logical track in the rewrite area of the sequential access medium, with only one faulty encoded data block from a particular sub data set being rewritten in a single encoded data block set in the rewrite area.

In another embodiment, the logic is configured to cause the processing circuit 612 to write, using a plurality of write transducers of a magnetic head, a data set to a sequential access medium, the data set including a number of sub data sets of fixed size, each sub data set including a plurality of encoded data blocks that include codewords in an interleaved arrangement. Also, each codeword includes a predetermined number of symbols. The logic is also configured to cause the processing circuit 612 to read, using a plurality of read transducers of the magnetic head, the data set immediately after being written to the sequential access medium in a read-while-write process to identify one or more faulty encoded data blocks, each of the one or more faulty encoded data blocks including at least one faulty codeword. Also, the logic is configured to cause the processing circuit 612 to decode the data set read from the sequential access medium to determine the one or more faulty encoded data blocks, where an encoded data block is determined to be faulty in response to detection of a threshold number of errors therein after the encoded data block is decoded. In addition, the logic is configured to cause the processing circuit 612 to select one or more logical tracks from one or more unique predetermined subsets of logical tracks in a rewrite area of the sequential access medium to rewrite the one or more faulty encoded data blocks, the rewrite area being positioned subsequent to a position of the data set first written on the sequential access medium. Each of the predetermined subsets of logical tracks includes three logical tracks. Moreover, the logic is configured to cause the processing circuit 612 to rewrite the one or more faulty encoded data blocks within one or more encoded data block sets to the one or more logical tracks in the rewrite area of the sequential access medium. Only one faulty encoded data block from a particular sub data set is rewritten in a single encoded data block set in the rewrite area, with each encoded data block being written to the sequential access medium as two symbol-interleaved Reed-Solomon RS(384,364) C1 codewords over a Galois Field GF(1024).

In yet another general embodiment, the logic is configured to cause the processing circuit 612 to write, using a plurality of write transducers of a magnetic head, a data set to a sequential access medium, the data set including a number of sub data sets of fixed size, each sub data set including a plurality of encoded data blocks that include codewords in an interleaved arrangement. Also, each codeword includes a predetermined number of symbols. The logic is also configured to cause the processing circuit 612 to read, using a plurality of read transducers of the magnetic head, the data set immediately after being written to the sequential access medium in a read-while-write process to identify one or more faulty encoded data blocks, each of the one or more faulty encoded data blocks including at least one faulty codeword. Also, the logic is configured to cause the processing circuit 612 to decode the data set read from the sequential access medium to determine the one or more faulty encoded data blocks, where an encoded data block is determined to be faulty in response to detection of a threshold number of errors therein after the encoded data block is decoded. In addition, the logic is configured to cause the processing circuit 612 to select one or more logical tracks from one or more unique predetermined subsets of logical tracks in a rewrite area of the sequential access medium to rewrite the one or more faulty encoded data blocks, the rewrite area being positioned subsequent to a position of the data set first written on the sequential access medium. Each of the predetermined subsets of logical tracks includes three logical tracks. Moreover, the logic is configured to cause the processing circuit 612 to rewrite the one or more faulty encoded data blocks within one or more encoded data block sets to the one or more logical tracks in the rewrite area of the sequential access medium. Only one faulty encoded data block from a particular sub data set is rewritten in a single encoded data block set in the rewrite area, with each encoded data block being written to the sequential access medium as Reed-Solomon RS(768,728) C1 codeword over a Galois Field GF(1024).

With currently implemented C1 codes used in conjunction with a conventional rewrite strategy, reducing the signal-to-noise ratio (SNR) for data stored to a sequential access medium would result in a loss of available storage capacity for user data (in contrast with data that is used up as overhead for error detection/correction algorithms, rewrites, etc.) because excess rewrites would be performed during read-while-write processing due to a high C1 error rate that results from the combination of the C1 code being used and the rewrite scheme.

Accordingly, improvements are needed to the rewrite strategy to take advantage of all potential gains derived from using iterative decoding to store/retrieve data from the sequential access medium. Specifically, it is desirable to operate a data channel at a lower SNR by increasing the symbol error rate at which an about 1% rewrite rate is achieved by about one order. In other words, it is desired for the symbol error rate at the C1 decoder input corresponding to about a 1% rewrite rate to be in a range from $1 \times 10^{-3}$ to $1 \times 10^{-2}$. Furthermore, codewords currently utilized in CWIs have a relatively small error correction capability. These codewords are only configured to correct five to six bytes of erroneous data per codeword. This limits the flexibility in choosing a rewrite error threshold, as the threshold is only able to be selected up to six bytes. Currently, CWIs with C1 codewords that contain four or more errors are rewritten. It would be beneficial to be able to select the rewrite error threshold from a much larger range of numbers. Also, it is desirable to increase the rewrite efficiency by minimizing the number of CWI sets that are rewritten for each data set.

Figure 7:
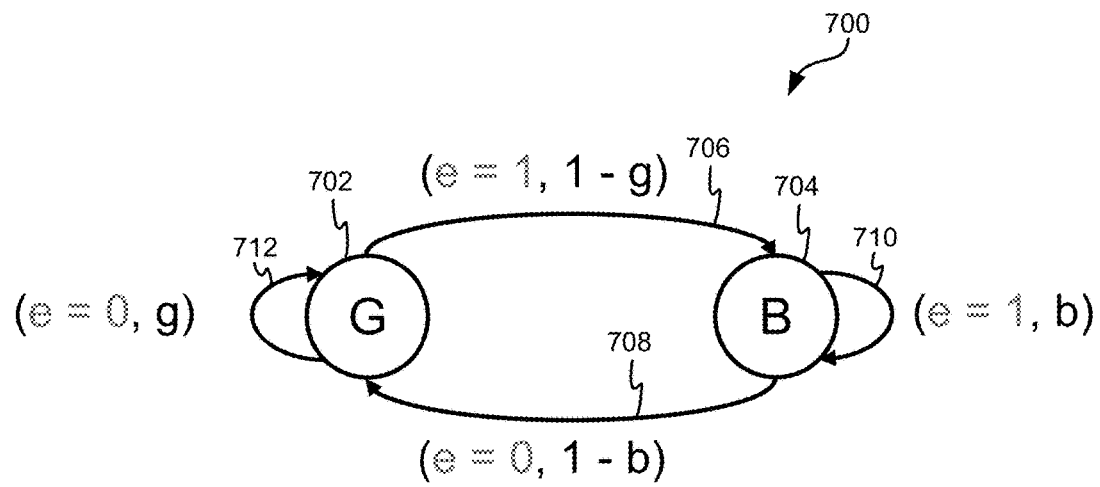
FIG. 7 shows a Gilbert burst-error model according to one embodiment.

Now referring to FIG. 7, an error model 700 is shown according to one embodiment. This error model 700 relies on a simple two-state Gilbert burst-error model that accounts for error propagation. A binary bit error value (e) indicates the presence of an error, i.e., either e=0 (no error) or e=1 (error). There are two states in error model 700: Good (G) 702 (where e=0, with probability of being in state G of g) and Bad (B) 704 (where e=1, with probability of being in state B of b). Each state transition 706, 708, 710, 712 is labeled by a pair of values: (error value, state transition probability). State B 704 is reachable from state G 702 via transition 706 (where e=1, having a state transition probability of 1−g) and by remaining in state B 704 via steady state transition 710 (e=1, probability of b). State G 702 is reachable from state B 704 via transition 708 (where e=0, having a state transition probability of 1−b) and by remaining in state G 702 via steady state transition 712 (e=0, probability of g). This error model 700 may be used to describe the correlated bit errors at a Reed-Solomon (RS) decoder input. In one approach, the correlated bit errors at the RS decoder input may be determined by only two parameters: $p_b$, which represents the raw bit error probability at the RS decoder input, and b which represents the probability of staying in state B (e.g., b=15/16=93.75% in accordance with one decoder arrangement).

The probability (g) of staying in state G 702 as a function of $p_b$ and b is: $g=(1-p_b)+p_b (b-p_b)/(1-p_b)$. Therefore, a steady state probability of being in state G 702 is: $(1-b)/(2-b-g)$, while a steady state probability of being in state B 704 is: $(1-g)/(2-b-g)$.

Figure 8:
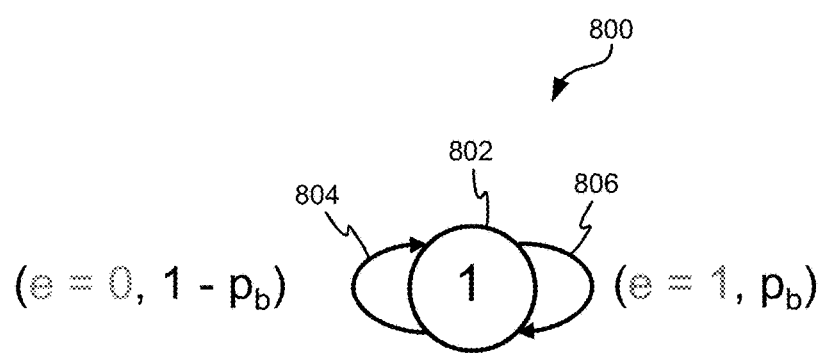
FIG. 8 shows an independent bit-error model according to one embodiment.

With reference to FIG. 8, an independent bit-error model 800 is shown according to one embodiment. This error model 800 is a very simple one-state bit error model for additive white Gaussian noise (AWGN) leading to independent bit errors at the RS decoder input. In this error model 800, there is only one state 802, with two transitions 804, 806. The first transition 804 indicates no error (e=0, having a state transition probability of $1-p_b$), while the second transition 806 indicates an error (e=1, having a state transition probability of $p_b$). The binary bit error value (e) may have one of two values, either e=0 (indicating no error) or e=1 (indicating error). According to one embodiment, this error model 800 is determined by only one parameter: $p_b$, which represents the raw bit error probability at the RS decoder input.

Figure 9:
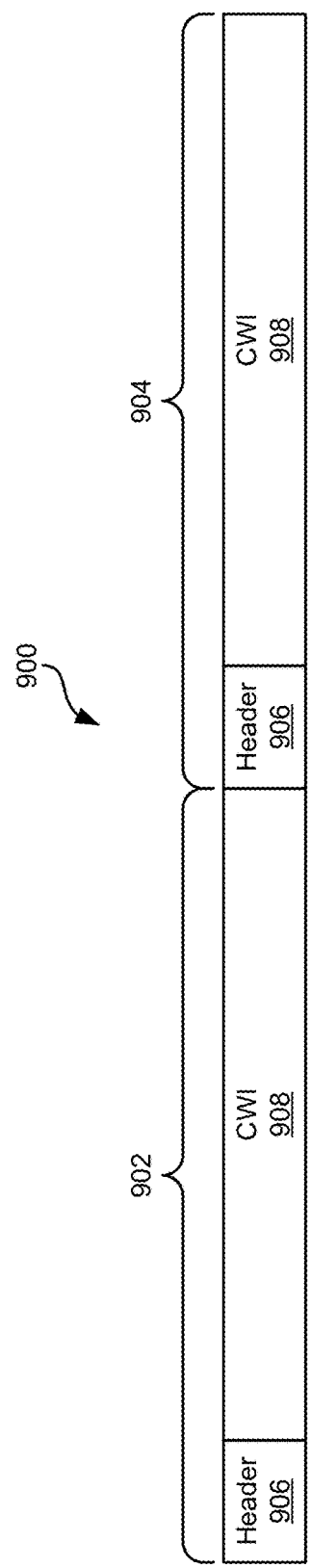
FIG. 9 shows a simplified block diagram of a codeword object according to one embodiment.

With reference to FIG. 9, a simplified block diagram of a codeword object 900 is shown according to one embodiment. The codeword object 900 includes two headerized CWIs 902, 904, but is not limited to having two headerized CWIs therein, as it may have more or less. Each headerized CWI 902, 904 includes, but is not limited to, a header 906 and a CWI 908 that includes one or more codewords symbol-interleaved together.

Each header 906 has a size of 12 bytes, in one embodiment, but may be longer or shorter in other embodiments not specifically described herein. For example, the header 906 may be 6 bytes, 8 bytes, 10 bytes, 14 bytes, 16 bytes, etc. In addition, each CWI 908 has a size of 960 bytes, in one embodiment, but may be greater or less in length in other embodiments not specifically described herein. For example, the CWI 908 may be 984 bytes, 998 bytes, 1024 bytes, 1472 bytes, 1920 bytes, etc.

Table 1 below shows sizes of the CWI 908 that are included in the codeword object 900 according to three different embodiments. Each scheme utilizes a Reed-Solomon (RS) code, with the C1 code being represented as RS(N,K), and is produced over a Galois Field (GF) of a predetermined number of symbols, represented by GF(Q).

TABLE 1

| CWI Size (bits) | Codeword Size N (symbols) | Information Size K (symbols) | Code over GF(Q) | Symbol Size (bits) | Error Correction (symbols) | Interleaving Depth |
|---|---|---|---|---|---|---|
| 7680 | 240 | 228 | GF(256) | 8 | 6 | 4 |
| 7680 | 384 | 364 | GF(1024) | 10 | 10 | 2 |
| 7680 | 768 | 728 | GF(1024) | 10 | 20 | 1 |

In the first embodiment, each CWI is 7680 bits in length and the RS code being used to encode data is RS(240,228) over GF(256) resulting in an ability to correct six error symbols per codeword. Moreover, the interleaving depth is four, resulting in four codewords being included in each CWI (e.g., a CWI-4), with each codeword using symbols having a symbol size of eight bits. In the second embodiment, each CWI is 7680 bits in length and the RS code being used to encode data is RS(384,364) over GF(1024) resulting in an ability to correct ten error symbols per codeword. Moreover, the interleaving depth is two, resulting in two codewords being included in each CWI (e.g., a CWI-2), with each codeword using symbols having a symbol size of ten bits. In the third embodiment, each CWI is 7680 bits in length and the RS code being used to encode data is RS(768,728) over GF(1024) resulting in an ability to correct twenty error symbols per codeword. Moreover, the interleaving depth is one, resulting in one codeword being included in each CWI (e.g., a CWI-1), with each codeword using symbols having a symbol size of ten bits. CWI-1, CWI-2, and CWI-4 are examples of encoded data blocks (EDB) comprising codewords in an interleaved (e.g., CWI-2 and CWI-4) or non-interleaved (CWI-1) arrangement.

These three embodiments were examined using predictive models to illustrate advantages that each provides over conventional encoding/decoding schemes, as shown in the graphs of FIGS. 10A, 10B, 11A, and 11B.

Figure 10A:
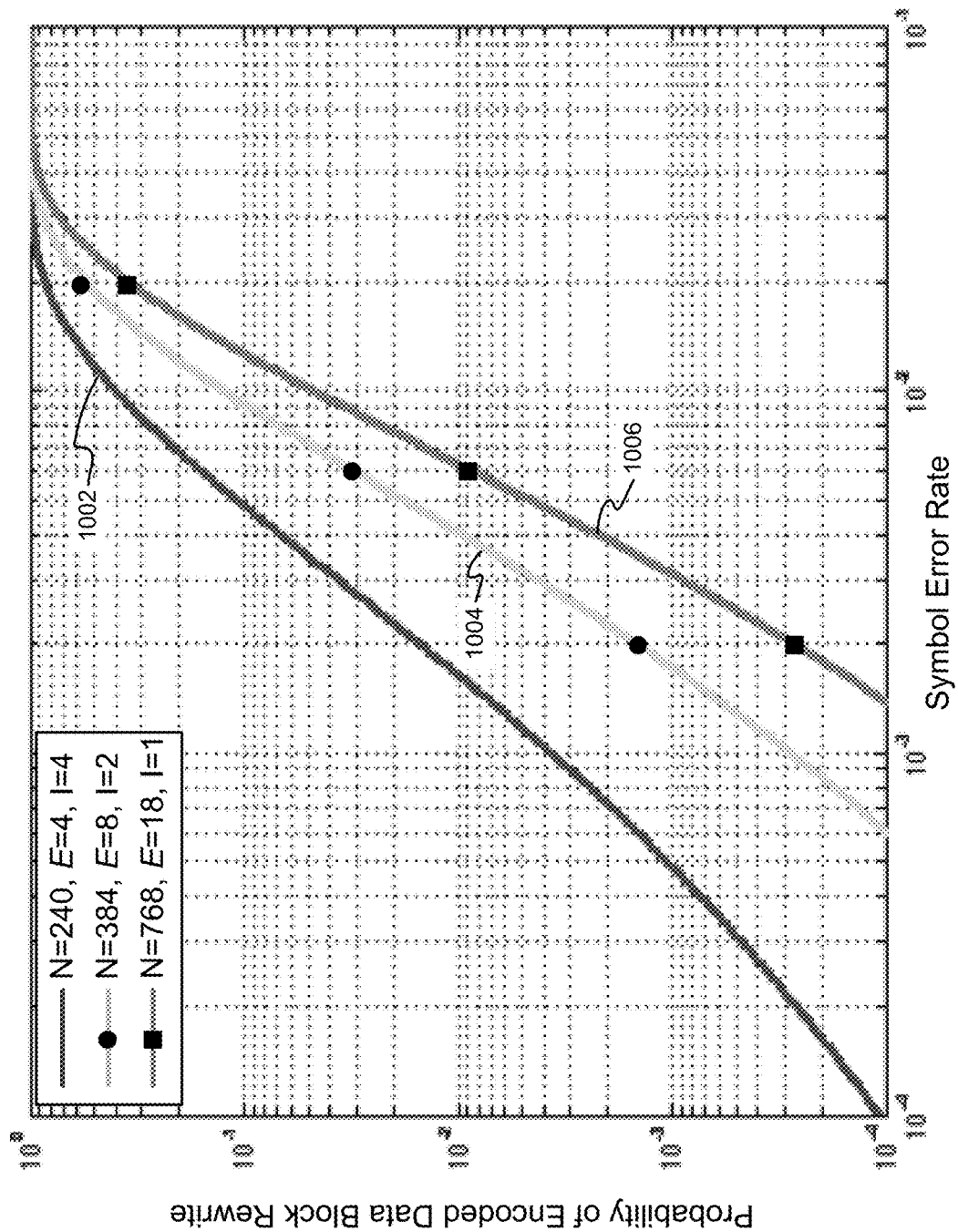
FIG. 10A is a plot of probability of encoded data block (EDB) rewrite versus symbol error rate using the Gilbert burst-error model according to several embodiments.

As shown in FIG. 10A, using a Gilbert burst-error model with b=15/16 at the C1 decoder input, the probability of encoded data block rewrite is plotted versus the symbol error rate at the C1 decoder input. Each scenario represented in this plot assumes a rewrite threshold set to equal two less than the maximum error correction capability of the particular code, as the error correction threshold. Note that in the first embodiment, the maximum error correction capability is 6, in the second embodiment, the maximum error correction capability is 10, and in the third embodiment, the maximum error correction capability is 20. The rewrite threshold dictates whether data is rewritten or not, and indicates the number of errors that are allowed within a codeword before the data is rewritten, e.g., data is rewritten in response to the number of errors in a codeword equaling or exceeding the rewrite threshold, E.

In the plot of FIG. 10A, the upper line 1002 represents the first embodiment using an RS C1 code with N=240, a rewrite threshold of E=4, and an interleaving depth of I=4. The middle line 1004 represents the second embodiment using an RS code with N=384, a rewrite threshold of E=8, and an interleaving depth of I=2. The bottom line 1006 represents the third embodiment using an RS code with N=768, a rewrite threshold of E=18, and an interleaving depth of I=1.

As can be seen in the plot of FIG. 10A, at any particular EDB rewrite rate, greater performance (larger symbol error rate) is achieved for the third embodiment, followed by the performance of the second embodiment, and then the first embodiment. This is because for rewrite purposes, greater performance is indicated by having the same rewrite rate (indicated on the y-axis) at a larger symbol error rate at the input of the C1 decoder. A larger symbol error rate at the input of C1 decoder translates to operation at lower SNR values. Therefore, the third embodiment allows the storage device to operate at the lowest SNR while keeping the rewrite rate constant.

Figure 10B:
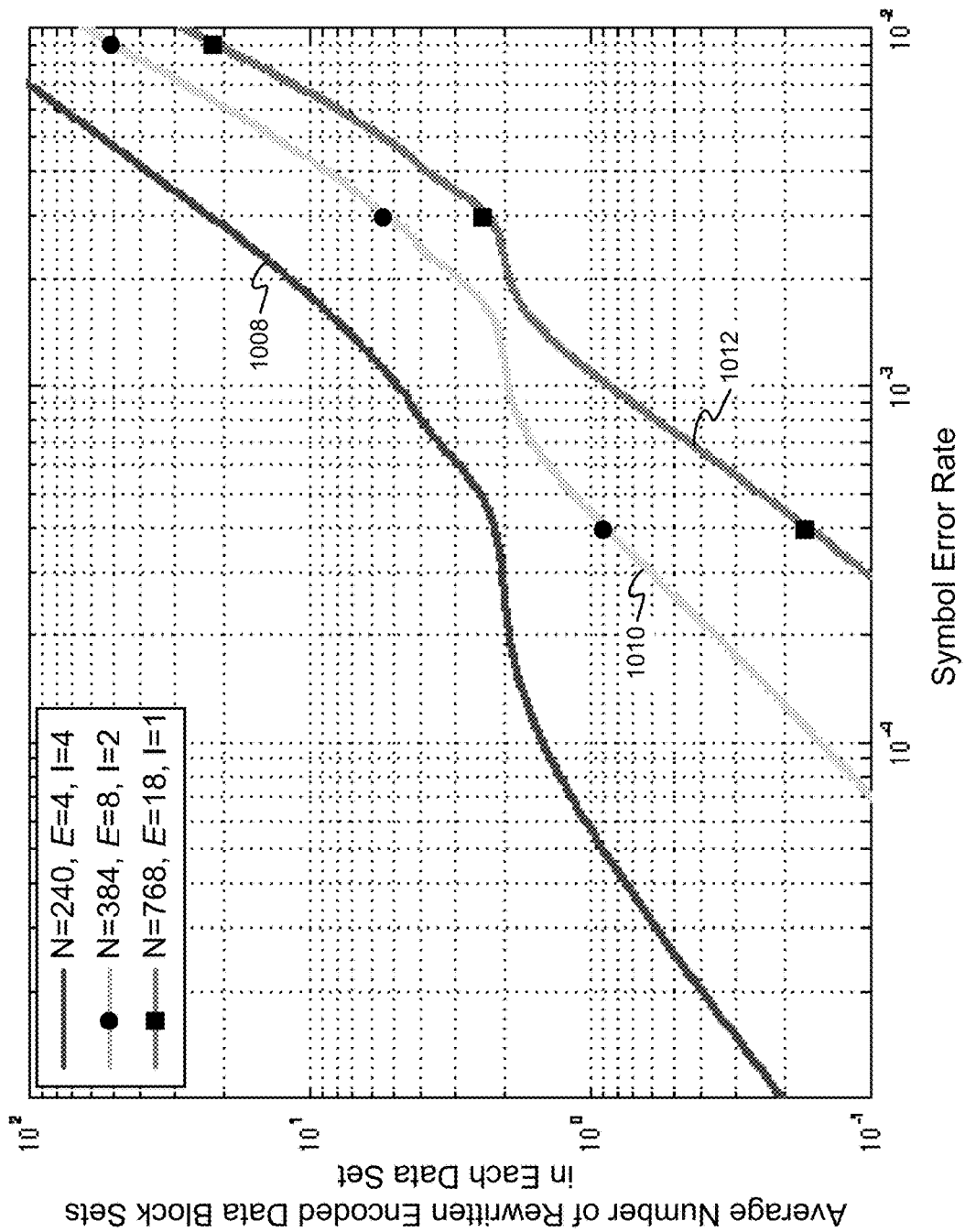
FIG. 10B is a plot of average number of rewritten EDB sets per data set (DS) using the Gilbert burst-error model according to several embodiments.

Now referring to FIG. 10B, using the Gilbert burst-error model with b=15/16 at the C1 decoder input, the average number of rewritten encoded data block sets per data set (DS) is plotted versus the symbol error rate at the C1 decoder input. In the plot of FIG. 10B, the upper line 1008 represents the first embodiment using an RS code with N=240, a rewrite threshold of E=4, and an interleaving depth of I=4. The middle line 1010 represents the second embodiment using an RS code with N=384, a rewrite threshold of E=8, and an interleaving depth of I=2. The bottom line 1012 represents the third embodiment using an RS code with N=768, a rewrite threshold of E=18, and an interleaving depth of I=1. The y-axis indicates the average number of rewritten encoded data block sets in a DS, with $10^1$ representing about a 5% rewrite rate, and $10^0$ representing about a 0.5% rewrite rate. A smaller rewrite rate achieves greater performance from the scheme.

As can be seen in the plot of FIG. 10B, for any particular symbol error rate, greater performance (lower rewrite rate) is achieved for the third embodiment, followed by the performance of the second embodiment, and then the first embodiment.

Figure 11A:
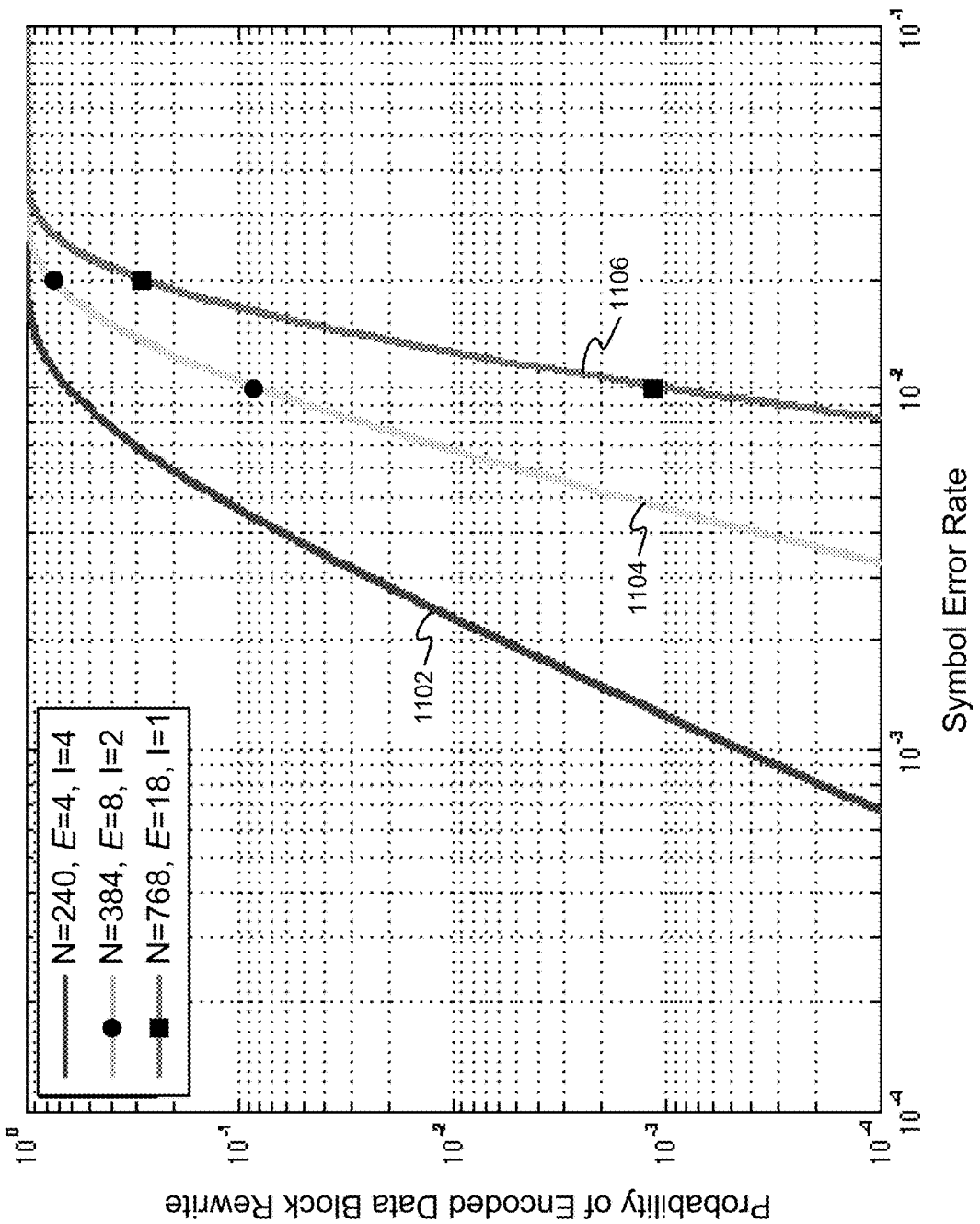
FIG. 11A is a plot of probability of EDB rewrite versus symbol error rate using the independent symbol error model according to several embodiments.

As shown in FIG. 11A, using the independent symbol error model at the C1 decoder input, the probability of encoded data block rewrite is plotted versus the symbol error rate at the C1 decoder input. The upper line 1102 represents the first embodiment using an RS code with N=240, a rewrite threshold of E=4, and an interleaving depth of I=4. The middle line 1104 represents the second embodiment using an RS code with N=384, a rewrite threshold of E=8, and an interleaving depth of I=2. The bottom line 1106 represents the third embodiment using an RS code with N=768, a rewrite threshold of E=18, and an interleaving depth of I=1.

As can be seen in the plot of FIG. 11A, at any particular codeword rewrite rate, greater performance (larger symbol error rate) is achieved for the third embodiment, followed by the performance of the second embodiment, and then the first embodiment.

Figure 11B:
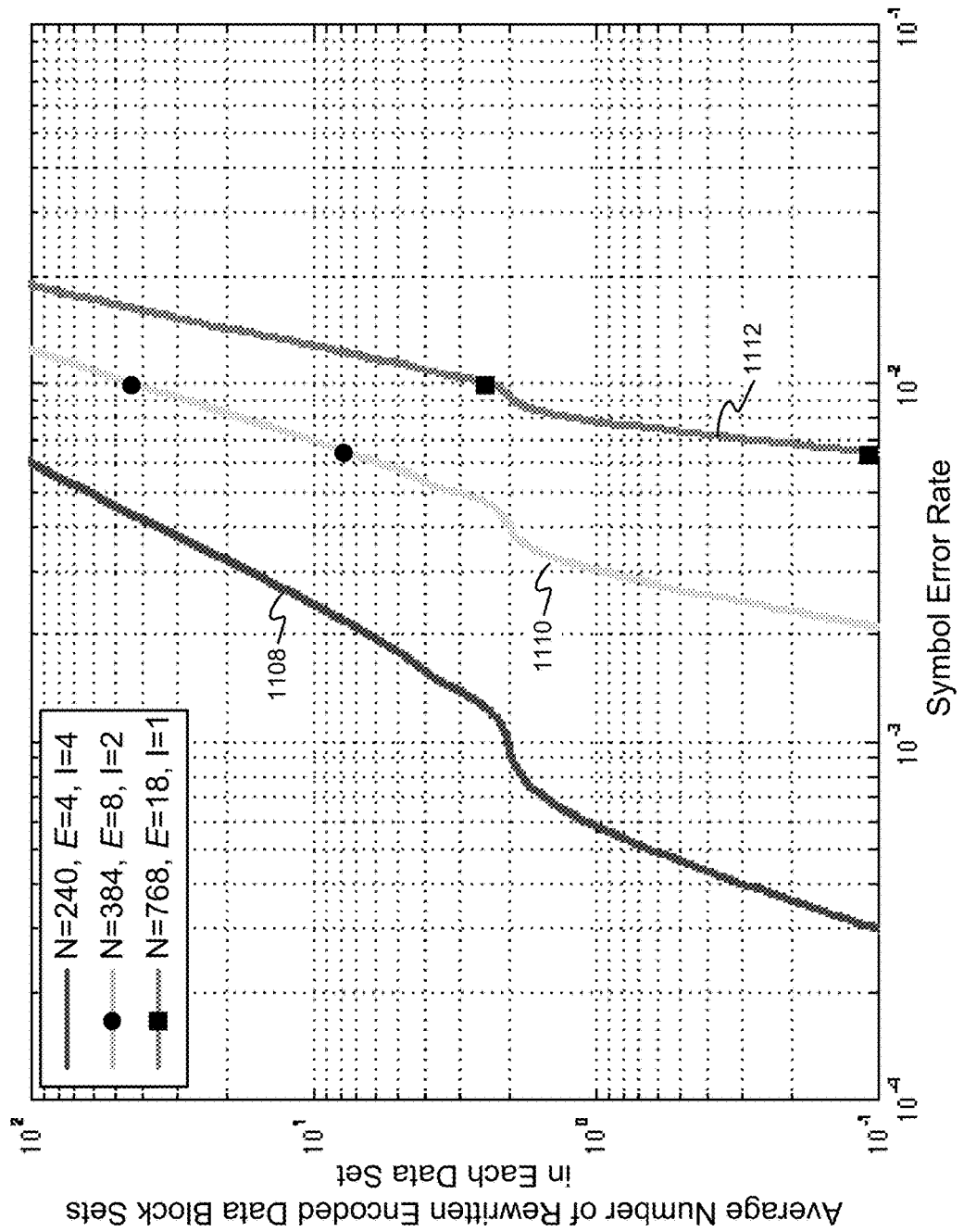
FIG. 11B is a plot of average number of rewritten EDB sets per DS using the independent symbol error model according to several embodiments.

Now referring to FIG. 11B, using the independent symbol error model at the C1 decoder input, the average number of rewritten encoded data block sets per DS is plotted versus the symbol error rate. In the plot of FIG. 11B, the upper line 1108 represents the first embodiment using an RS code with N=240, a rewrite threshold of E=4, and an interleaving depth of I=4. The middle line 1110 represents the second embodiment using an RS code with N=384, a rewrite threshold of E=8, and an interleaving depth of I=2. The bottom line 1112 represents the third embodiment using an RS code with N=768, a rewrite threshold of E=18, and an interleaving depth of I=1. The y-axis indicates the average number of rewritten encoded data block sets per DS, with $10^1$ representing about a 5% rewrite rate, and $10^0$ representing about a 0.5% rewrite rate. A smaller rewrite rate achieves greater performance from the scheme.

As can be seen in the plot of FIG. 11B, for any particular symbol error rate, greater performance (lower rewrite rate) is again achieved for the third embodiment, followed by the performance of the second embodiment, and then the first embodiment.

With reference to FIG. 12, an exemplary flexible rewrite table is shown according to one example. This flexible rewrite table is established with the following parameters: M=32, S=64, R=15, D1=1, D2=1, and a subset of logical tracks for rewrite totaling three. For these parameters, M denotes the total number of channels, S denotes the total number of sub data sets in a DS, R is the rotation parameter of the rewrite table, and D1+D2+1 indicates the size of the subset of logical tracks. Of course, similar flexible rewrite tables may be established using any combination of parameters that may be implemented in the systems and methods described herein in various embodiments, as would be understood by those of skill in the art upon reading the present descriptions. The flexible rewrite table indicates that for a particular encoded data block (EDB) set, c, and a particular track to be rewritten in the rewrite area, t, from which EDBs may be rewritten to a specific combination of EDB set, c, and logical track, t. For example, for EDB set 1 and logical track 1, one encoded data block may be rewritten from only one of sub data sets 34, 35, 36, 37, 38, or 39. In another example, for EDB set 3 and logical track 5, one encoded data block may be rewritten from only one of sub data sets 46, 47, 48, 49, 50, or 51. In yet another example, for EDB set 2 and logical track 30, one encoded data block may be rewritten from only one of sub data sets 62, 63, 0, 1, 2, or 3.

A flexible rewrite table may be utilized to generate the available logical tracks which may have data rewritten thereon for a rewrite scheme. In this way, the flexible rewrite table, which indicates on which logical tracks data may be rewritten, may be consulted in order to determine the subset of logical tracks on which data may be rewritten for any particular EDB from a particular EDB set.

For the descriptions of FIGS. 13-19, the following definitions apply. A sequential access medium includes a plurality of physical tracks. In contrast to a physical track on the medium, a logical track indicates how data is divided up when stored to the medium, with each logical track being denoted as i, where $0 \le i \le M-1$. M denotes the number of channels of the system that writes data or the number of physical tracks of the sequential access medium that are written simultaneously by the system, such as a tape drive, optical drive, etc. The logical tracks i are mapped onto the physical tracks of the medium, and a multitude of sets of logical tracks will be mapped across the plurality of physical tracks of the medium, as there are typically more physical tracks than logical tracks.

Figure 13:
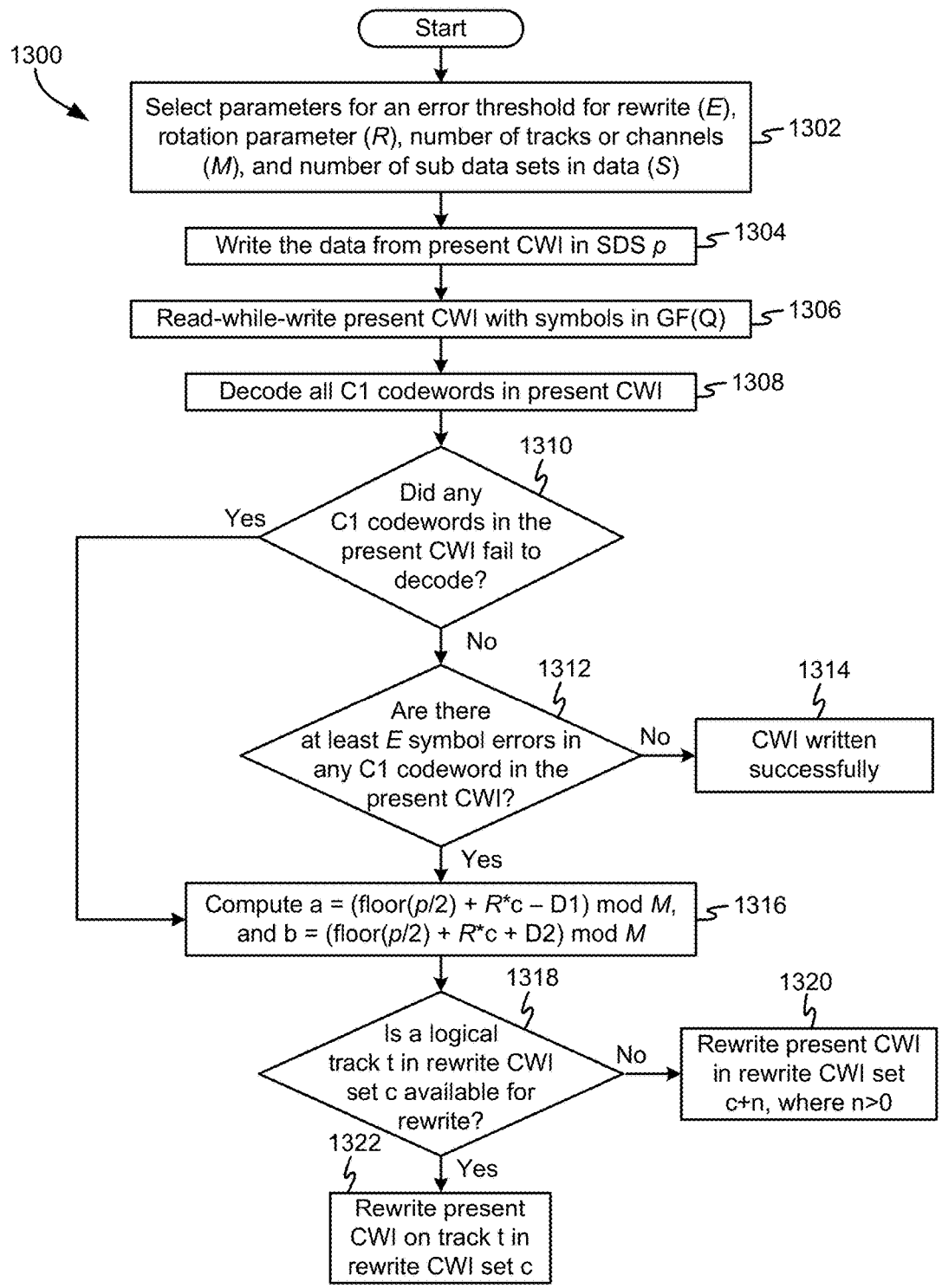
FIG. 13 shows a method according to one embodiment.

Now referring to FIG. 13, a method 1300 for writing and rewriting data to a sequential access medium is shown according to one embodiment. The method 1300 may be performed in accordance with the present invention in any of the environments depicted in FIGS. 1-9, among others, in various embodiments. Of course, more or less operations than those specifically described in FIG. 13 may be included in method 1300, as would be understood by one of skill in the art upon reading the present descriptions. Parameters which are denoted by capital letters are constants throughout the calculations of method 1300, while lower case denoted parameters are variables.

Each of the steps of the method 1300 may be performed by any suitable component of the operating environment. For example, in various embodiments, the method 1300 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1300. Illustrative processors include, but are not limited to, a CPU, an ASIC, a FPGA, etc., combinations thereof, or any other suitable computing device known in the art.

As shown in FIG. 13, method 1300 may initiate with operation 1302, where four parameter values, E, R, M, and S, are set, according to preferences of the user, desired results, specifics of the drive operating the sequential access medium, and/or the sequential access medium itself. E is used to denote an error threshold for rewrite, and may be set according to the number of errors within a CWI which triggers a rewrite of the CWI. In various approaches, E may be set in a range from 1 up to the maximum number of correctable errors per codeword. E is usually fixed and preset by firmware of the storage device. In one embodiment, E may be selected in response to the number of errors occurring in CWIs written on a particular sequential access medium and subsequently read during a read-while-write process increasing or decreasing, such that the rewrite area does not grow to be larger than desired. R is used to denote a rotation parameter for rewrite, which indicates how data is rewritten to tracks of the sequential access medium during rewrite, and is understood by those of skill in the art. In various approaches, R may be set in a range that is equal to the value of M, e.g., R∈{0, 1, 2, . . . , 31|M=32}. M is used to denote the number of channels, and is reliant on the drive being used. S indicates a number of sub data sets in the sample data set being analyzed and is based on how the data is stored to the medium. In one embodiment, S=2*M.

In operation 1304, data is written to the sequential access medium. In one embodiment, the data is organized in a CWI from SDS numbered p encoded by RS(N,K), and the CWI includes I symbol-interleaved C1 codewords over GF(Q).

The value of p may take any value within the range 0≤p<S, across the range of sub data sets being analyzed. In various embodiment, I may be set to 1, 2, 4, etc., but may be set to any suitable number of interleaved codewords as would be understood by one of skill in the art.

The Galois field (GF) may have any suitable number of symbols Q. In first embodiment, Q is set to 256, and in the second and third embodiments, Q is set to 1024, but may have any value known in the art, such as 512, 2056, 4128, etc.

According to the first embodiment, N is set to 240, in the second embodiment, N is set to 384, and in the third embodiment, N is set to 768. Furthermore, N may take any suitable value known in the art.

In the first embodiment, K is set to 228, in the second embodiment, K is set to 364, and in the third embodiment, K is set to 728. Furthermore, K may take any suitable value known in the art.

In operation 1306, the just-written CWI is read in a read-while-write process. In operation 1308, all codewords in the CWI are decoded to determine C1 codewords encoded therein.

In operation 1310, it is determined whether any C1 codewords within the CWI failed to decode. In response to failure to decode at least one C1 codeword in CWI from SDS numbered p, method 1300 jumps to operation 1316; otherwise, in response to all C1 codewords in CWI from SDS numbered p decoding successfully, method 1300 continues to operation 1312.

In operation 1312, it is determined whether the number of symbol errors within any single decoded C1 codeword is equal to or greater than the rewrite error threshold, E (e.g., # errors for C1 codeword ≥E). In response to no C1 codewords including at least E symbol errors therein, method 1300 moves to operation 1314; otherwise, in response to at least one C1 codeword including at least E symbol errors therein, method 1300 continues to operation 1316.

In operation 1314, as a result of there being less than E symbol errors in every C1 codeword, it is determined that the CWI was written successfully, and that no rewriting is deemed advantageous.

In operation 1316, two boundaries are computed, a first bound, a, and a second bound, b. In one embodiment, a=(floor(p/2)+R*c−D1) mod M, and b=(floor(p/2)+R*c+D2) mod M, where c is a number of the present rewritten CWI set and c, D1 is a nonnegative constant (e.g., 0, 1, 2, etc.), D2 is a nonnegative constant (e.g., 0, 1, 2, etc.), and either a<b, or a>b (for a wrap-around situation), i.e., a≠b. In one embodiment, D1+D2>0.

In operation 1318, it is determined whether a logical track, t, in the rewrite CWI set, c, is available for rewrite, where (a≤t≤b if a<b) and (t≥a or t≤b if b<a), where 0≤t<M. A logical track is not available for rewrite in response to a determination that another CWI in the present SDS p has already been scheduled to be rewritten in the rewrite CWI set c on a particular track t across all such tracks t for (a≤t≤b if a<b), or (t≥a or t≤b if b<a).

In response to no logical tracks in the present rewrite CWI set c being available for rewrite, method 1300 moves to operation 1320; otherwise, in response to logical track t being available for rewrite in rewrite CWI set c, method 1300 continues to operation 1322.

In operation 1320, the present CWI is rewritten on a track in rewrite CWI set c+n, where n>0. In other words, the present CWI is rewritten in a portion of the rewrite area following the portion of the rewrite area being used to rewrite the present rewrite CWI set c.

In operation 1322, the present CWI is rewritten on track t in rewrite CWI set c, where (a≤t≤b if a<b) and (t≥a or t≤b if b<a).

Figure 14:
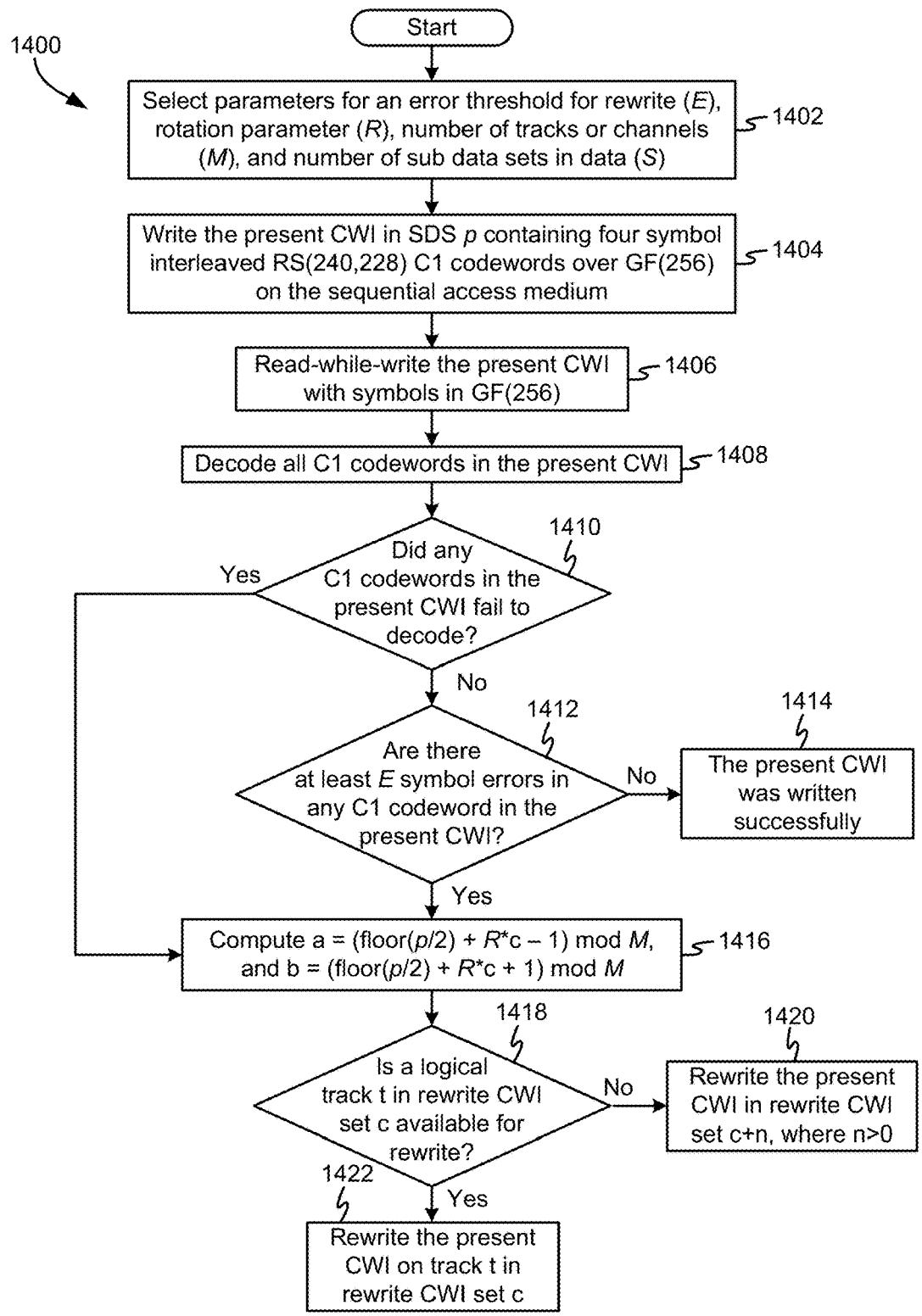
FIG. 14 shows a method according to a first embodiment.

Now referring to FIG. 14, a method 1400 for writing and rewriting data to a sequential access medium is shown according to the first embodiment. The method 1400 may be performed in accordance with the present invention in any of the environments depicted in FIGS. 1-9, among others, in various embodiments. Of course, more or less operations than those specifically described in FIG. 14 may be included in method 1400, as would be understood by one of skill in the art upon reading the present descriptions. Parameters which are denoted by capital letters are constants throughout the calculations of method 1400, while lower case denoted parameters are variables.

Each of the steps of the method 1400 may be performed by any suitable component of the operating environment. For example, in various embodiments, the method 1400 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1400. Illustrative processors include, but are not limited to, a CPU, an ASIC, a FPGA, etc., combinations thereof, or any other suitable computing device known in the art.

As shown in FIG. 14, method 1400 may initiate with operation 1402, where four parameter values, E, R, M, and S, are set, according to preferences of the user, desired results, specifics of the drive operating the sequential access medium, and/or the sequential access medium itself. E is used to denote an error threshold for rewrite, and may be set according to the number of errors within a CWI which triggers a rewrite of the CWI. In various approaches, E may be set in a range from 1 up to the maximum number of correctable errors per codeword. R is used to denote a rotation parameter for rewrite, which indicates how data is rewritten to tracks of the sequential access medium during rewrite, and is understood by those of skill in the art. In various approaches, R may be set in a range that is equal to the value of M, e.g., R∈{0, 1, 2, . . . , 31|M=32}. M is used to denote the number of channels, and is reliant on the drive being used. S indicates a number of sub data sets in the sample data set being analyzed and is based on how the data is stored to the medium. In one embodiment, S=2*M.

In operation 1404, the present CWI in SDS p is written to the sequential access medium. In this embodiment, the present CWI from SDS p is encoded by RS(240,228), and the CWI includes four symbol-interleaved C1 codewords over GF(256).

In operation 1406, the just-written CWI is read in a read-while-write process with symbols in GF(256). In operation 1408, all codewords in the CWI are decoded to determine C1 codewords encoded therein.

In operation 1410, it is determined whether any C1 codewords within the CWI from SDS numbered p failed to decode. In response to failure to decode at least one C1 codeword in CWI from SDS numbered p, method 1400 jumps to operation 1416; otherwise, in response to all C1 codewords in CWI from SDS numbered p decoding successfully, method 1400 continues to operation 1412.

In operation 1412, it is determined whether the number of symbol errors within any single decoded C1 codeword is equal to or greater than the rewrite error threshold, E (e.g., # errors for C1 codeword $\geq$E). In response to no C1 codewords including at least E symbol errors therein, method 1400 moves to operation 1414; otherwise, in response to at least one C1 codeword including at least E symbol errors therein, method 1400 continues to operation 1416.

In operation 1414, as a result of there being less than E symbol errors in every C1 codeword, it is determined that the CWI was written successfully, and that no rewriting is deemed advantageous.

In operation 1416, two boundaries are computed, a first bound, a, and a second bound, b. In one embodiment, $a=(\text{floor}(p/2)+R*c-1) \mod M$, and $b=(\text{floor}(p/2)+R*c+1) \mod M$, where c is a number of the present rewritten CWI set and $0 \leq c$, and either a<b, or a>b (for a wrap-around situation), i.e., a$\neq$b. This allows for the present CWI from SDS numbered p to be rewritten on a range of logical tracks, the range including logical tracks greater than and less than the current logical track by one.

In operation 1418, it is determined whether a logical track, t, in the rewrite CWI set, c, is available for rewrite, where ($a \leq t \leq b$ if a<b) and ($t \geq a$ or $t \leq b$ if b<a), where $0 \leq t < M$. A logical track is not available for rewrite in response to a determination that another CWI in the present SDS p has already been scheduled to be rewritten in the rewrite CWI set c on a particular track t across all such tracks t for ($a \leq t \leq b$ if a<b), or ($t \geq a$ or $t \leq b$ if b<a).

In response to no logical tracks in the present rewrite CWI set c being available for rewrite, method 1400 moves to operation 1420; otherwise, in response to logical track t being available for rewrite in rewrite CWI set c, method 1400 continues to operation 1422.

In operation 1420, the present CWI is rewritten on a track in rewrite CWI set c+n, where n>0. In other words, the present CWI is rewritten in a portion of the rewrite area following the portion of the rewrite area being used to rewrite the present rewrite CWI set c.

In operation 1422, the present CWI is rewritten on track t in rewrite CWI set c, where ($a \leq t \leq b$ if a<b) and ($t \geq a$ or $t \leq b$ if b<a).

Figure 15:
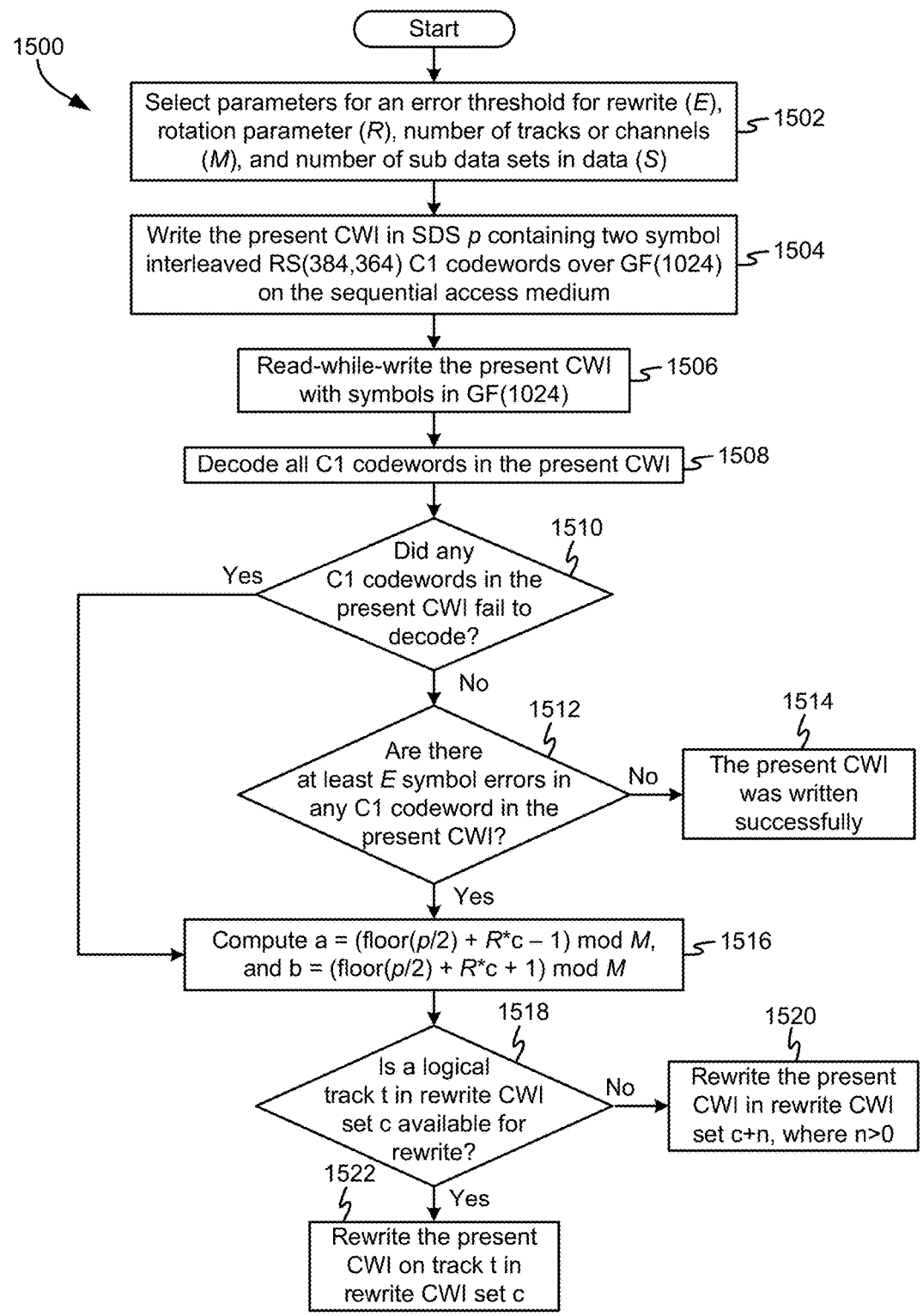
FIG. 15 shows a method according to a second embodiment.

Now referring to FIG. 15, a method 1500 for writing and rewriting data to a sequential access medium is shown according to the second embodiment. The method 1500 may be performed in accordance with the present invention in any of the environments depicted in FIGS. 1-9, among others, in various embodiments. Of course, more or less operations than those specifically described in FIG. 15 may be included in method 1500, as would be understood by one of skill in the art upon reading the present descriptions. Parameters which are denoted by capital letters are constants throughout the calculations of method 1500, while lower case denoted parameters are variables.

Each of the steps of the method 1500 may be performed by any suitable component of the operating environment. For example, in various embodiments, the method 1500 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1500. Illustrative processors include, but are not limited to, a CPU, an ASIC, a FPGA, etc., combinations thereof, or any other suitable computing device known in the art.

As shown in FIG. 15, method 1500 may initiate with operation 1502, where four parameter values, E, R, M, and S, are set, according to preferences of the user, desired results, specifics of the drive operating the sequential access medium, and/or the sequential access medium itself. E is used to denote an error threshold for rewrite, and may be set according to the number of errors within a CWI which triggers a rewrite of the CWI. In various approaches, E may be set in a range from 1 up to the maximum number of correctable errors per codeword. R is used to denote a rotation parameter for rewrite, which indicates how data is rewritten to tracks of the sequential access medium during rewrite, and is understood by those of skill in the art. In various approaches, R may be set in a range that is equal to the value of M, e.g., $R \in \{0, 1, 2, \ldots, 31 | M=32\}$. M is used to denote the number of channels, and is reliant on the drive being used. S indicates a number of sub data sets in the sample data set being analyzed and is based on how the data is stored to the medium. In one embodiment, $S=2*M$.

In operation 1504, the present CWI in SDS p is written to the sequential access medium. In this embodiment, the present CWI from SDS p is encoded by RS(384,364), and the CWI includes two symbol-interleaved C1 codewords over GF(1024).

In operation 1506, the just-written CWI is read in a read-while-write process with symbols in GF(1024). In operation 1508, all codewords in the CWI are decoded to determine C1 codewords encoded therein.

In operation 1510, it is determined whether any C1 codewords within the present CWI from SDS numbered p failed to decode. In response to failure to decode at least one C1 codeword in the CWI from SDS numbered p, method 1500 jumps to operation 1516; otherwise, in response to all C1 codewords in CWI from SDS numbered p decoding successfully, method 1500 continues to operation 1512.

In operation 1512, it is determined whether the number of symbol errors within any single decoded C1 codeword is equal to or greater than the rewrite error threshold, E (e.g., # errors for C1 codeword $\geq$E). In response to no C1 codewords including at least E symbol errors therein, method 1500 moves to operation 1514; otherwise, in response to at least one C1 codeword including at least E symbol errors therein, method 1500 continues to operation 1516.

In operation 1514, as a result of there being less than E symbol errors in every C1 codeword, it is determined that the CWI was written successfully, and that no rewriting is deemed advantageous.

In operation 1516, two boundaries are computed, a first bound, a, and a second bound, b. In one embodiment, $a=(\text{floor}(p/2)+R*c-1) \mod M$, and $b=(\text{floor}(p/2)+R*c+1) \mod M$, where c is a number of the present rewritten CWI set and $0 \leq c$, and either a<b, or a>b (for a wrap-around situation), i.e., a$\neq$b. This allows for the present CWI from SDS numbered p to be rewritten on a range of logical tracks, the range including logical tracks greater than and less than the current logical track by one.

In operation 1518, it is determined whether a logical track, t, in the rewrite CWI set, c, is available for rewrite, where (a≤t≤b if a<b) and (t≥a or t≤b if b<a), where 0≤t<M. A logical track is not available for rewrite in response to a determination that another CWI in the present SDS p has already been scheduled to be rewritten in the rewrite CWI set c on a particular track t across all such tracks t for (a≤t≤b if a<b), or (t≥a or t≤b if b<a).

In response to no logical tracks in the present rewrite CWI set c being available for rewrite, method 1500 moves to operation 1520; otherwise, in response to logical track t being available for rewrite in rewrite CWI set c, method 1500 continues to operation 1522.

In operation 1520, the present CWI is rewritten on a track in rewrite CWI set c+n, where n>0. In other words, the present CWI is rewritten in a portion of the rewrite area following the portion of the rewrite area being used to rewrite the present rewrite CWI set c.

In operation 1522, the present CWI is rewritten on track t in rewrite CWI set c, where (a≤t≤b if a<b) and (t≥a or t≤b if b<a).

Figure 16:
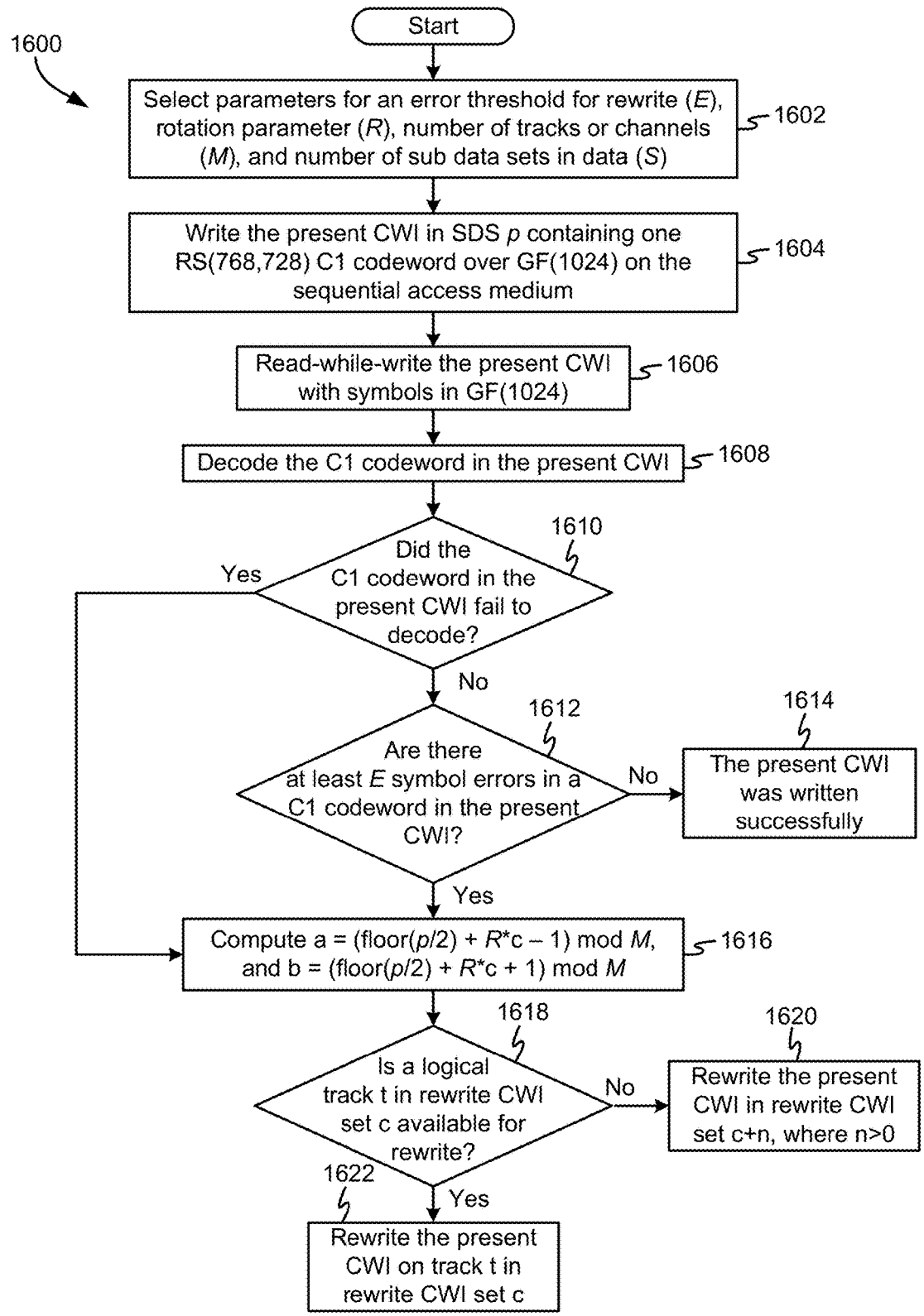
FIG. 16 shows a method according to a third embodiment.

Now referring to FIG. 16, a method 1600 for writing and rewriting data to a sequential access medium is shown according to the third embodiment. The method 1600 may be performed in accordance with the present invention in any of the environments depicted in FIGS. 1-9, among others, in various embodiments. Of course, more or less operations than those specifically described in FIG. 16 may be included in method 1600, as would be understood by one of skill in the art upon reading the present descriptions. Parameters which are denoted by capital letters are constants throughout the calculations of method 1600, while lower case denoted parameters are variables.

Each of the steps of the method 1600 may be performed by any suitable component of the operating environment. For example, in various embodiments, the method 1600 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1600. Illustrative processors include, but are not limited to, a CPU, an ASIC, a FPGA, etc., combinations thereof, or any other suitable computing device known in the art.

As shown in FIG. 16, method 1600 may initiate with operation 1602, where four parameter values, E, R, M, and S, are set, according to preferences of the user, desired results, specifics of the drive operating the sequential access medium, and/or the sequential access medium itself. E is used to denote an error threshold for rewrite, and may be set according to the number of errors within a CWI which triggers a rewrite of the CWI. In various approaches, E may be set in a range from 1 up to the maximum number of correctable errors per codeword. R is used to denote a rotation parameter for rewrite, which indicates how data is rewritten to tracks of the sequential access medium during rewrite, and is understood by those of skill in the art. In various approaches, R may be set in a range that is equal to the value of M, e.g., R∈{0, 1, 2, ..., 31|M=32}. M is used to denote the number of channels, and is reliant on the drive being used. S indicates a number of sub data sets in the sample data set being analyzed and is based on how the data is stored to the medium. In one embodiment, S=2*M.

In operation 1604, the present CWI in SDS p is written to the sequential access medium. In this embodiment, the present CWI from SDS p is encoded by RS(768,728), and the CWI includes one C1 codeword over GF(1024), and therefore is not actually a codeword interleave of multiple codewords, but instead is just one codeword.

In operation 1606, the just-written CWI is read in a read-while-write process with symbols in GF(1024). In operation 1608, the codeword in the CWI is decoded to determine C1 codewords encoded therein.

In operation 1610, it is determined whether the C1 codeword of the present CWI from SDS numbered p failed to decode. In response to failure to decode the C1 codeword in CWI from SDS numbered p, method 1600 jumps to operation 1616; otherwise, in response to the C1 codeword in CWI from SDS numbered p decoding successfully, method 1600 continues to operation 1612.

In operation 1612, it is determined whether the number of symbol errors within the decoded C1 codeword is equal to or greater than the rewrite error threshold, E (e.g., # errors for C1 codeword ≥E). In response to the C1 codeword not including at least E symbol errors therein, method 1600 moves to operation 1614; otherwise, in response to the C1 codeword including at least E symbol errors therein, method 1600 continues to operation 1616.

In operation 1614, as a result of there being less than E symbol errors in the C1 codeword, it is determined that the CWI was written successfully, and that no rewriting is deemed advantageous.

In operation 1616, two boundaries are computed, a first bound, a, and a second bound, b. In one embodiment, a=(floor(p/2)+R*c−1) mod M, and b=(floor(p/2)+R*c+1) mod M, where c is a number of the present rewritten CWI set and 0≤c, and either a<b, or a>b (for a wrap-around situation), i.e., a≠b. This allows for the present CWI from SDS numbered p to be rewritten on a range of logical tracks, the range including logical tracks greater than and less than the current logical track by one.

In operation 1618, it is determined whether a logical track, t, in the rewrite CWI set, c, is available for rewrite, where (a≤t≤b if a<b) and (t≥a or t≤b if b<a), where 0≤t<M. A logical track is not available for rewrite in response to a determination that another CWI in the present SDS p has already been scheduled to be rewritten in the rewrite CWI set c on a particular track t across all such tracks t for (a≤t≤b if a<b), or (t≥a or t≤b if b<a).

In response to no logical tracks in the present rewrite CWI set c being available for rewrite, method 1600 moves to operation 1620; otherwise, in response to logical track t being available for rewrite in rewrite CWI set c, method 1600 continues to operation 1622.

In operation 1620, the present CWI is rewritten on a track in rewrite CWI set c+n, where n>0. In other words, the present CWI is rewritten in a portion of the rewrite area following the portion of the rewrite area being used to rewrite the present rewrite CWI set c.

In operation 1622, the present CWI is rewritten on track t in rewrite CWI set c, where (a≤t≤b if a<b) and (t≥a or t≤b if b<a).

Figure 17:
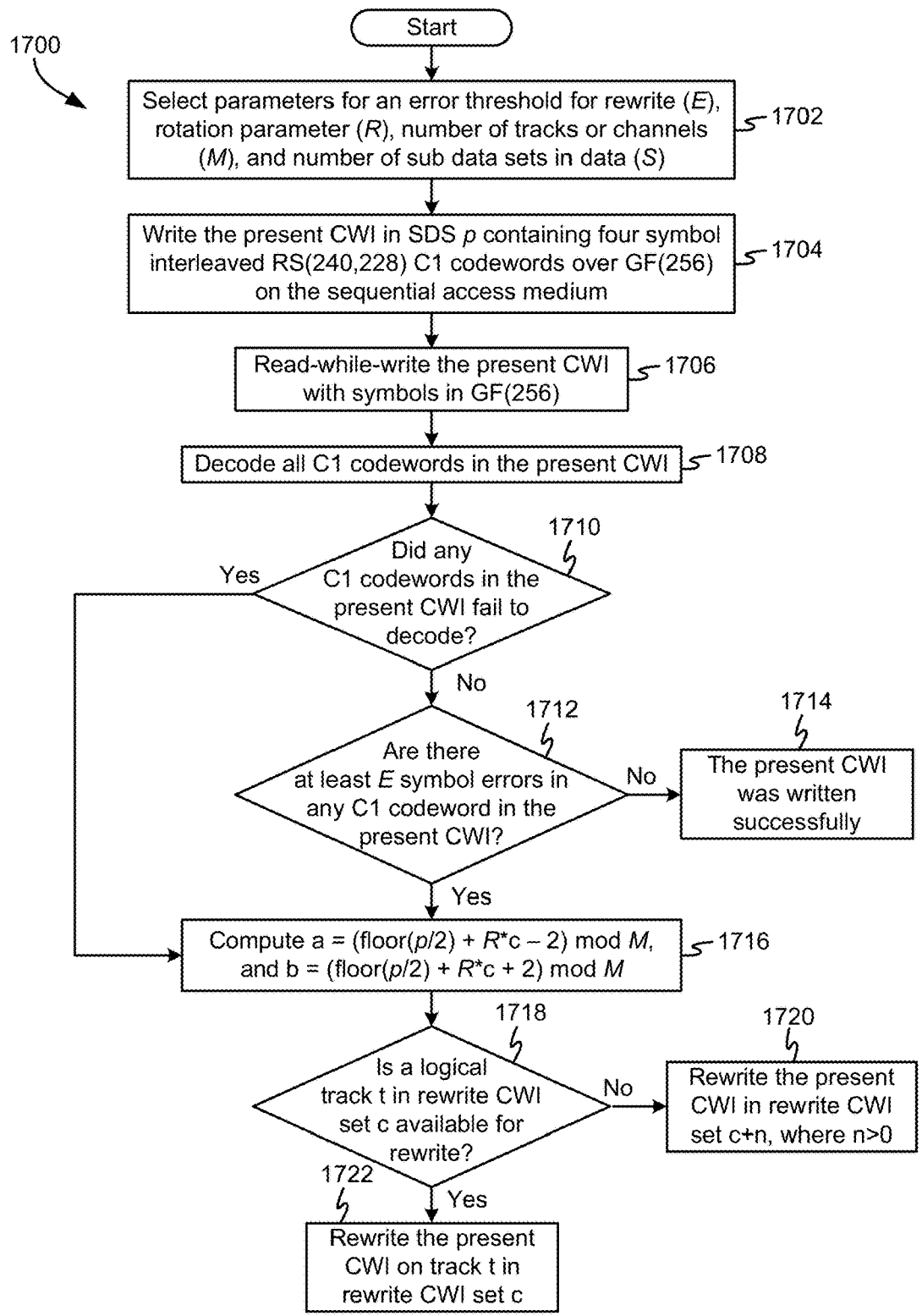
FIG. 17 shows a method according to one embodiment.

Now referring to FIG. 17, a method 1700 for writing and rewriting data to a sequential access medium is shown according to a fourth embodiment. The method 1700 may be performed in accordance with the present invention in any of the environments depicted in FIGS. 1-9, among others, in various embodiments. Of course, more or less operations than those specifically described in FIG. 17 may be included in method 1700, as would be understood by one of skill in the art upon reading the present descriptions. Parameters which are denoted by capital letters are constants throughout the calculations of method 1700, while lower case denoted parameters are variables.

Each of the steps of the method 1700 may be performed by any suitable component of the operating environment. For example, in various embodiments, the method 1700 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1700. Illustrative processors include, but are not limited to, a CPU, an ASIC, a FPGA, etc., combinations thereof, or any other suitable computing device known in the art.

As shown in FIG. 17, method 1700 may initiate with operation 1702, where four parameter values, E, R, M, and S, are set, according to preferences of the user, desired results, specifics of the drive operating the sequential access medium, and/or the sequential access medium itself. E is used to denote an error threshold for rewrite, and may be set according to the number of errors within a CWI which triggers a rewrite of the CWI. In various approaches, E may be set in a range from 1 up to the maximum number of correctable errors per codeword. R is used to denote a rotation parameter for rewrite, which indicates how data is rewritten to tracks of the sequential access medium during rewrite, and is understood by those of skill in the art. In various approaches, R may be set in a range that is equal to the value of M, e.g., $R \in \{0, 1, 2, \ldots, 31 | M=32\}$. M is used to denote the number of channels, and is reliant on the drive being used. S indicates a number of sub data sets in the sample data set being analyzed and is based on how the data is stored to the medium. In one embodiment, $S=2*M$.

In operation 1704, the present CWI in SDS p is written to the sequential access medium. In this embodiment, the present CWI from SDS p is encoded by RS(240,228), and the CWI includes four symbol-interleaved C1 codewords over GF(256).

In operation 1706, the just-written CWI is read in a read-while-write process with symbols in GF(256). In operation 1708, all codewords in the CWI are decoded to determine C1 codewords encoded therein.

In operation 1710, it is determined whether any C1 codewords within the CWI from SDS numbered p failed to decode. In response to failure to decode at least one C1 codeword in CWI from SDS numbered p, method 1700 jumps to operation 1716; otherwise, in response to all C1 codewords in CWI from SDS numbered p decoding successfully, method 1700 continues to operation 1712.

In operation 1712, it is determined whether the number of symbol errors within any single decoded C1 codeword is equal to or greater than the rewrite error threshold, E (e.g., # errors for C1 codeword $\geq E$). In response to no C1 codewords including at least E symbol errors therein, method 1700 moves to operation 1714; otherwise, in response to at least one C1 codeword including at least E symbol errors therein, method 1700 continues to operation 1716.

In operation 1714, as a result of there being less than E symbol errors in every C1 codeword, it is determined that the CWI was written successfully, and that no rewriting is deemed advantageous.

In operation 1716, two boundaries are computed, a first bound, a, and a second bound, b. In one embodiment, $a=(\text{floor}(p/2)+R*c-2) \mod M$, and $b=(\text{floor}(p/2)+R*c+2)$ mod M, where c is a number of the present rewritten CWI set and $0 \leq c$, and either $a<b$, or $a>b$ (for a wrap-around situation), i.e., $a \neq b$. This allows for the present CWI from SDS numbered p to be rewritten on a range of logical tracks, the range including logical tracks greater than and less than the current logical track by two.

In operation 1718, it is determined whether a logical track, t, in the rewrite CWI set, c, is available for rewrite, where ($a \leq t \leq b$ if $a<b$) and ($t \geq a$ or $t \leq b$ if $b<a$), where $0 \leq t < M$. A logical track is not available for rewrite in response to a determination that another CWI in the present SDS p has already been scheduled to be rewritten in the rewrite CWI set c on a particular track t across all such tracks t for ($a \leq t \leq b$ if $a<b$), or ($t \geq a$ or $t \leq b$ if $b<a$).

In response to no logical tracks in the present rewrite CWI set c being available for rewrite, method 1700 moves to operation 1720; otherwise, in response to logical track t being available for rewrite in rewrite CWI set c, method 1700 continues to operation 1722.

In operation 1720, the present CWI is rewritten on a track in rewrite CWI set c+n, where n>0. In other words, the present CWI is rewritten in a portion of the rewrite area following the portion of the rewrite area being used to rewrite the present rewrite CWI set c.

In operation 1722, the present CWI is rewritten on track t in rewrite CWI set c, where ($a \leq t \leq b$ if $a<b$) and ($t \geq a$ or $t \leq b$ if $b<a$).

Figure 18:
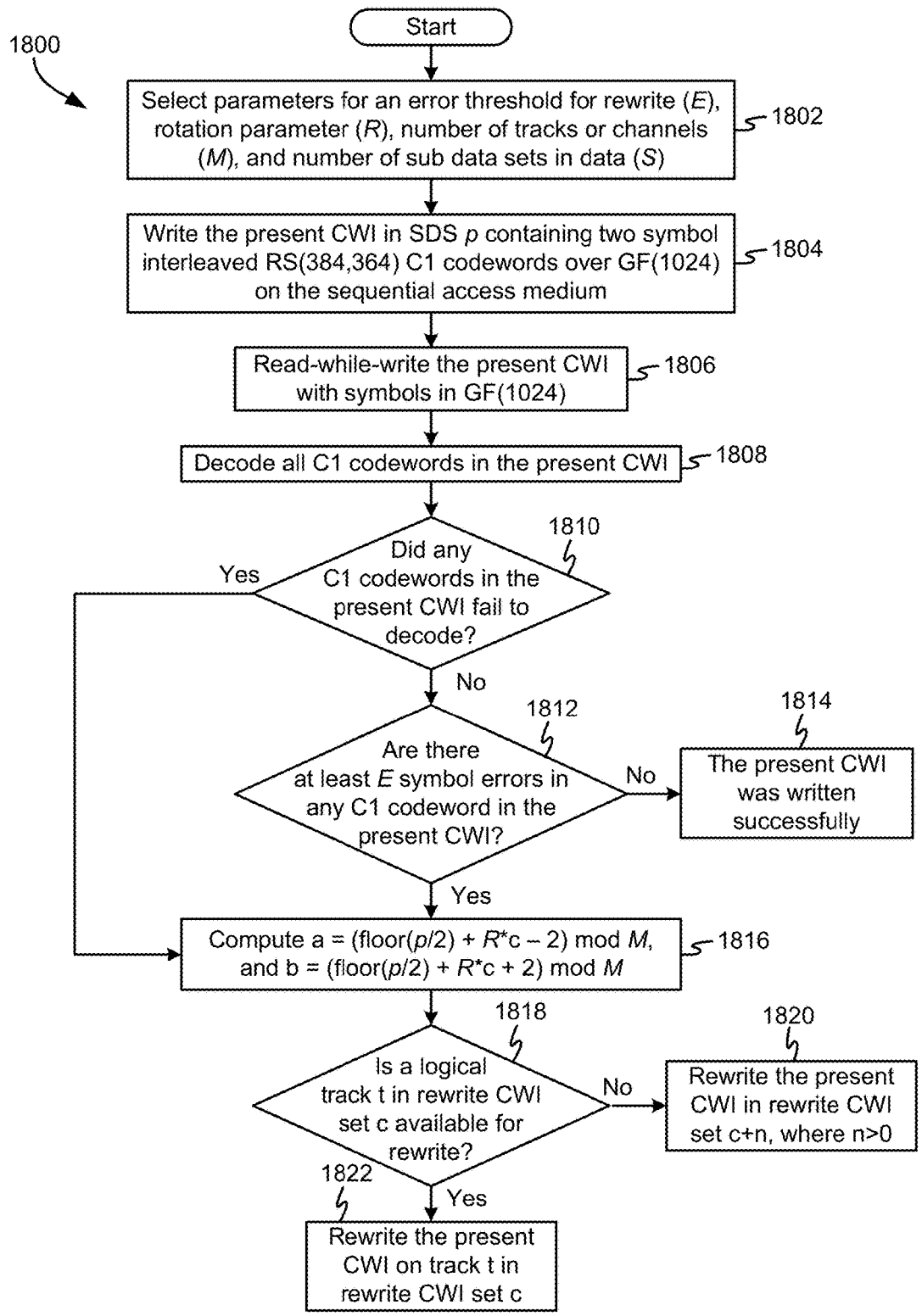
FIG. 18 shows a method according to one embodiment.

Now referring to FIG. 18, a method 1800 for writing and rewriting data to a sequential access medium is shown according to a fifth embodiment. The method 1800 may be performed in accordance with the present invention in any of the environments depicted in FIGS. 1-9, among others, in various embodiments. Of course, more or less operations than those specifically described in FIG. 18 may be included in method 1800, as would be understood by one of skill in the art upon reading the present descriptions. Parameters which are denoted by capital letters are constants throughout the calculations of method 1800, while lower case denoted parameters are variables.

Each of the steps of the method 1800 may be performed by any suitable component of the operating environment. For example, in various embodiments, the method 1800 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1800. Illustrative processors include, but are not limited to, a CPU, an ASIC, a FPGA, etc., combinations thereof, or any other suitable computing device known in the art.

As shown in FIG. 18, method 1800 may initiate with operation 1802, where four parameter values, E, R, M, and S, are set, according to preferences of the user, desired results, specifics of the drive operating the sequential access medium, and/or the sequential access medium itself. E is used to denote an error threshold for rewrite, and may be set according to the number of errors within a CWI which triggers a rewrite of the CWI. In various approaches, E may be set in a range from 1 up to the maximum number of correctable errors per codeword. R is used to denote a rotation parameter for rewrite, which indicates how data is rewritten to tracks of the sequential access medium during rewrite, and is understood by those of skill in the art. In various approaches, R may be set in a range that is equal to the value of M, e.g., $R \in \{0, 1, 2, \ldots, 31 | M=32\}$. M is used to denote the number of channels, and is reliant on the drive being used. S indicates a number of sub data sets in the sample data set being analyzed and is based on how the data is stored to the medium. In one embodiment, S=2*M.

In operation 1804, the present CWI in SDS p is written to the sequential access medium. In this embodiment, the present CWI from SDS p is encoded by RS(384,364), and the CWI includes two symbol-interleaved C1 codewords over GF(1024).

In operation 1806, the just-written CWI is read in a read-while-write process with symbols in GF(1024). In operation 1808, all codewords in the CWI are decoded to determine C1 codewords encoded therein.

In operation 1810, it is determined whether any C1 codewords within the present CWI from SDS numbered p failed to decode. In response to failure to decode at least one C1 codeword in CWI from SDS numbered p, method 1800 jumps to operation 1816; otherwise, in response to all C1 codewords in CWI from SDS numbered p decoding successfully, method 1800 continues to operation 1812.

In operation 1812, it is determined whether the number of symbol errors within any single decoded C1 codeword is equal to or greater than the rewrite error threshold, E (e.g., # errors for C1 codeword $\geq$E). In response to no C1 codewords including at least E symbol errors therein, method 1800 moves to operation 1814; otherwise, in response to at least one C1 codeword including at least E symbol errors therein, method 1800 continues to operation 1816.

In operation 1814, as a result of there being less than E symbol errors in every C1 codeword, it is determined that the CWI was written successfully, and that no rewriting is deemed advantageous.

In operation 1816, two boundaries are computed, a first bound, a, and a second bound, b. In one embodiment, a=(floor(p/2)+R*c−2) mod M, and b=(floor(p/2)+R*c+2) mod M, where c is a number of the present rewritten CWI set and $0 \leq c$, and either a<b, or a>b (for a wrap-around situation), i.e., a$\neq$b. This allows for the present CWI from SDS numbered p to be rewritten on a range of logical tracks, the range including logical tracks greater than and less than the current logical track by two.

In operation 1818, it is determined whether a logical track, t, in the rewrite CWI set, c, is available for rewrite, where (a$\leq$t$\leq$b if a<b) and (t$\geq$a or t$\leq$b if b<a), where 0$\leq$t<M. A logical track is not available for rewrite in response to a determination that another CWI in the present SDS p has already been scheduled to be rewritten in the rewrite CWI set c on a particular track t across all such tracks t for (a$\leq$t$\leq$b if a<b), or (t$\geq$a or t$\leq$b if b<a).

In response to no logical tracks in the present rewrite CWI set c being available for rewrite, method 1800 moves to operation 1820; otherwise, in response to logical track t being available for rewrite in rewrite CWI set c, method 1800 continues to operation 1822.

In operation 1820, the present CWI is rewritten on a track in rewrite CWI set c+n, where n>0. In other words, the present CWI is rewritten in a portion of the rewrite area following the portion of the rewrite area being used to rewrite the present rewrite CWI set c.

In operation 1822, the present CWI is rewritten on track t in rewrite CWI set c, where (a$\leq$t$\leq$b if a<b) and (t$\geq$a or t$\leq$b if b<a).

Figure 19:
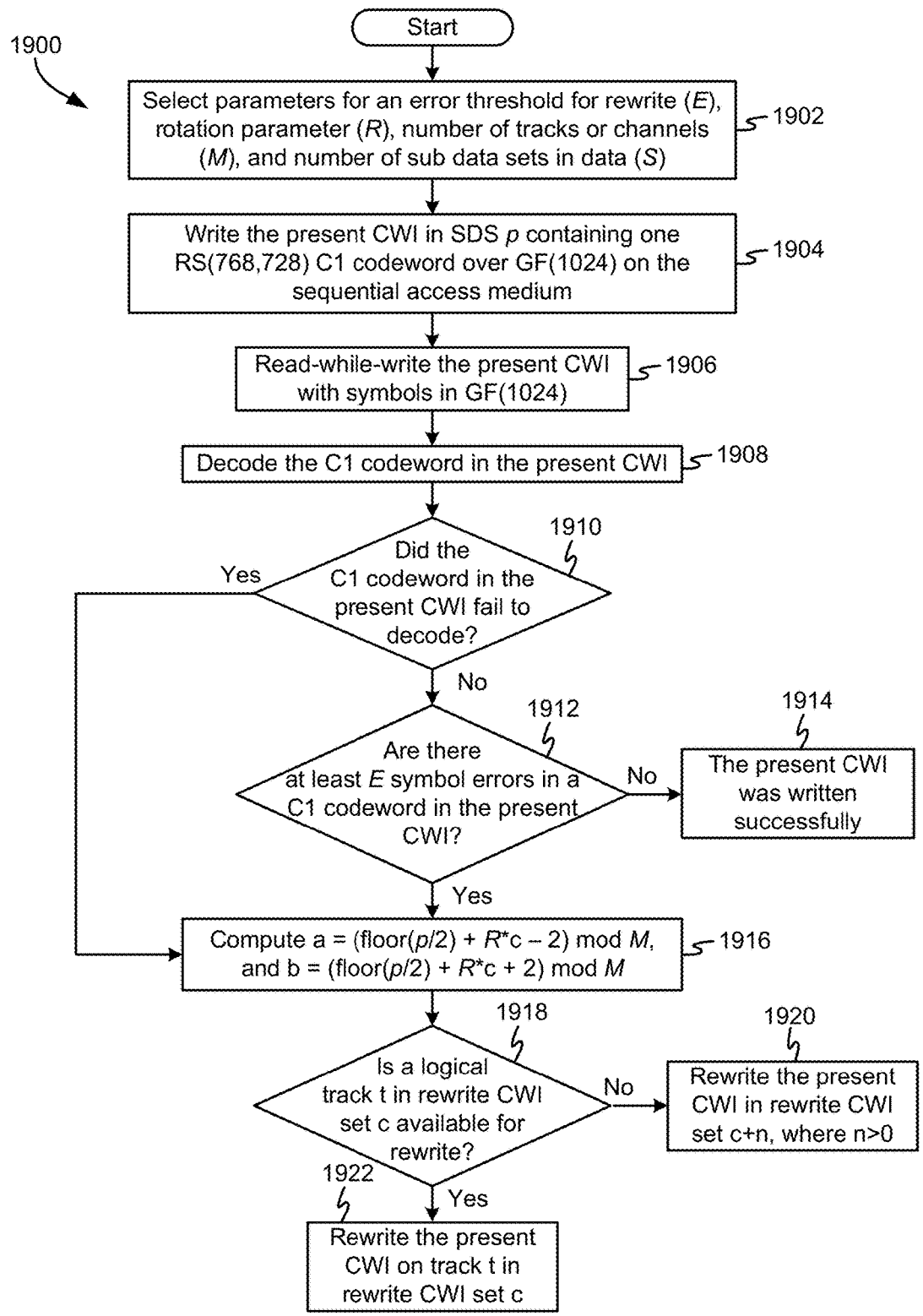
FIG. 19 shows a method according to one embodiment.

Now referring to FIG. 19, a method 1900 for writing and rewriting data to a sequential access medium is shown according to a sixth embodiment. The method 1900 may be performed in accordance with the present invention in any of the environments depicted in FIGS. 1-9, among others, in various embodiments. Of course, more or less operations than those specifically described in FIG. 19 may be included in method 1900, as would be understood by one of skill in the art upon reading the present descriptions. Parameters which are denoted by capital letters are constants throughout the calculations of method 1900, while lower case denoted parameters are variables.

Each of the steps of the method 1900 may be performed by any suitable component of the operating environment. For example, in various embodiments, the method 1900 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1900. Illustrative processors include, but are not limited to, a CPU, an ASIC, a FPGA, etc., combinations thereof, or any other suitable computing device known in the art.

As shown in FIG. 19, method 1900 may initiate with operation 1902, where four parameter values, E, R, M, and S, are set, according to preferences of the user, desired results, specifics of the drive operating the sequential access medium, and/or the sequential access medium itself. E is used to denote an error threshold for rewrite, and may be set according to the number of errors within a CWI which triggers a rewrite of the CWI. In various approaches, E may be set in a range from 1 up to the maximum number of correctable errors per codeword. R is used to denote a rotation parameter for rewrite, which indicates how data is rewritten to tracks of the sequential access medium during rewrite, and is understood by those of skill in the art. In various approaches, R may be set in a range that is equal to the value of M, e.g., R$\in$\{0, 1, 2, ..., 31|M=32\}. M is used to denote the number of channels, and is reliant on the drive being used. S indicates a number of sub data sets in the sample data set being analyzed and is based on how the data is stored to the medium. In one embodiment, S=2*M.

In operation 1904, the present CWI in SDS p is written to the sequential access medium. In this embodiment, the present CWI from SDS p is encoded by RS(768,728), and the CWI includes one C1 codeword over GF(1024).

In operation 1906, the just-written CWI is read in a read-while-write process with symbols in GF(1024). In operation 1908, the codeword of the CWI is decoded to determine the C1 codeword encoded therein.

In operation 1910, it is determined whether the C1 codeword within the present CWI from SDS numbered p failed to decode. In response to failure to decode the C1 codeword in CWI from SDS numbered p, method 1900 jumps to operation 1916; otherwise, in response to the C1 codeword in CWI from SDS numbered p decoding successfully, method 1900 continues to operation 1912.

In operation 1912, it is determined whether the number of symbol errors within the decoded C1 codeword is equal to or greater than the rewrite error threshold, E (e.g., # errors for C1 codeword $\geq$E). In response to the C1 codeword not including at least E symbol errors therein, method 1900 moves to operation 1914; otherwise, in response to the C1 codeword including at least E symbol errors therein, method 1900 continues to operation 1916.

In operation 1914, as a result of there being less than E symbol errors in the C1 codeword, it is determined that the CWI was written successfully, and that no rewriting is deemed advantageous.

In operation 1916, two boundaries are computed, a first bound, a, and a second bound, b. In one embodiment, a=(floor(p/2)+R*c−2) mod M, and b=(floor(p/2)+R*c+2) mod M, where c is a number of the present rewritten CWI set and 0≤c, and either a<b, or a>b (for a wrap-around situation), i.e., a≠b. This allows for the present CWI from SDS numbered p to be rewritten on a range of logical tracks, the range including logical tracks greater than and less than the current logical track by two.

In operation 1918, it is determined whether a logical track, t, in the rewrite CWI set, c, is available for rewrite, where (a≤t≤b if a<b) and (t≥a or t≤b if b<a), where 0≤t<M. A logical track is not available for rewrite in response to a determination that another CWI in the present SDS p has already been scheduled to be rewritten in the rewrite CWI set c on a particular track t across all such tracks t for (a≤t≤b if a<b), or (t≥a or t≤b if b<a).

In response to no logical tracks in the present rewrite CWI set c being available for rewrite, method 1900 moves to operation 1920; otherwise, in response to logical track t being available for rewrite in rewrite CWI set c, method 1900 continues to operation 1922.

In operation 1920, the present CWI is rewritten on a track in rewrite CWI set c+n, where n>0. In other words, the present CWI is rewritten in a portion of the rewrite area following the portion of the rewrite area being used to rewrite the present rewrite CWI set c.

In operation 1922, the present CWI is rewritten on track t in rewrite CWI set c, where (a≤t≤b if a<b) and (t≥a or t≤b if b<a).

Figure 20:
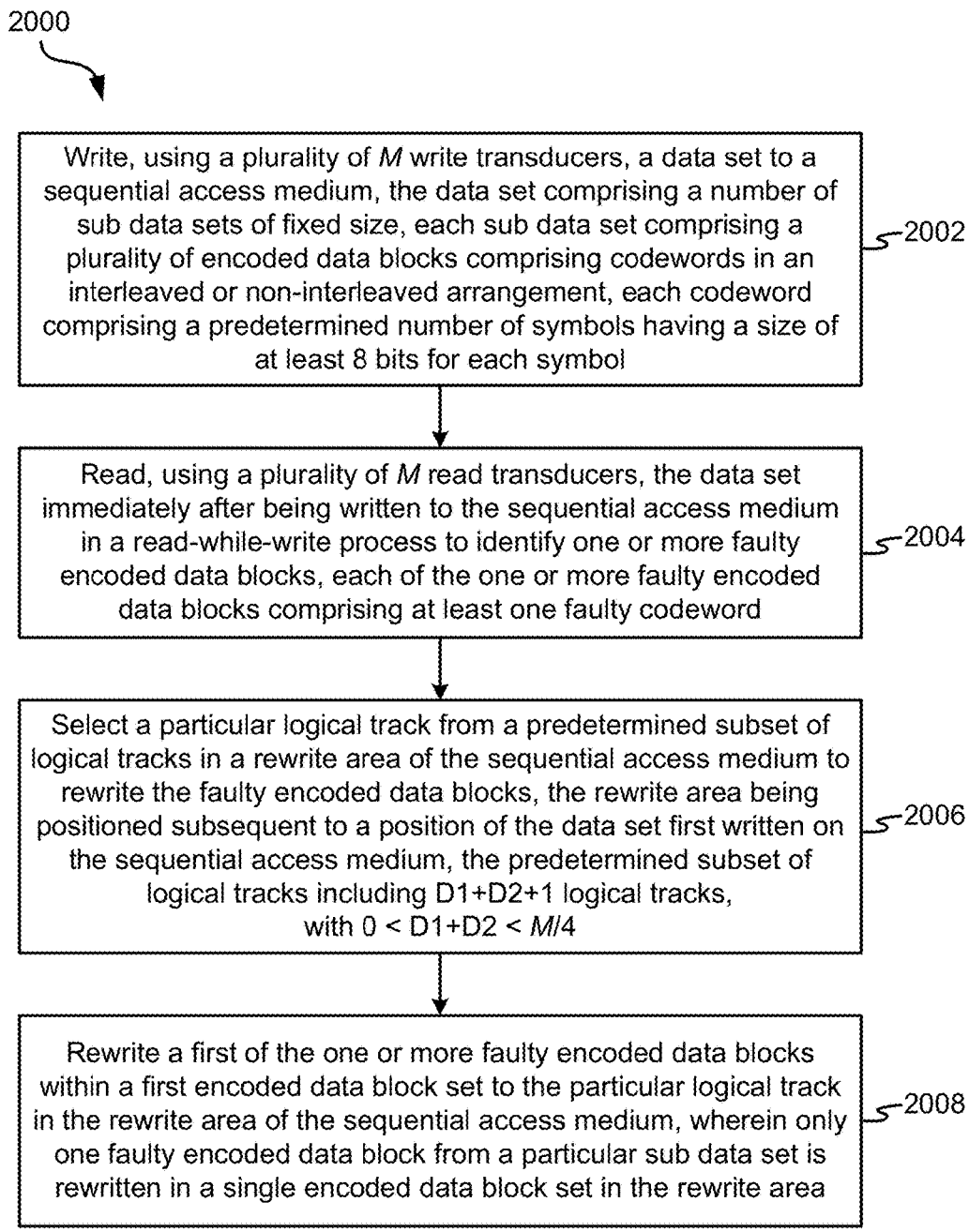
FIG. 20 shows a method according to one embodiment.

Now referring to FIG. 20, a method 2000 is shown for detecting dead tracks from a sequential access medium and/or dead channels in a storage device according to one embodiment. The method 2000 may be performed in accordance with the present invention in any of the environments depicted in FIGS. 1-19, among others, in various embodiments. Of course, more or less operations than those specifically described in FIG. 20 may be included in method 2000, as would be understood by one of skill in the art upon reading the present descriptions.

Each of the steps of the method 2000 may be performed by any suitable component of the operating environment. For example, in various embodiments, the method 2000 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 2000. Illustrative processors include, but are not limited to, a CPU, an ASIC, a FPGA, etc., combinations thereof, or any other suitable computing device known in the art.

As shown in FIG. 20, method 2000 may initiate with operation 2002, where a data set is written, using a plurality of write transducers of a magnetic head of a storage device (such as a tape drive, optical drive, etc.), to a sequential access medium. The data set includes a number of sub data sets of fixed size. Each of the sub data sets includes a plurality of encoded data blocks, with each encoded data block having codewords in an interleaved or non-interleaved arrangement. Each codeword includes a predetermined number of symbols, and each symbol has a size that is equal to or greater than 8 bits, including 8 bits, 10 bits, 12 bits, etc. The data is encoded by an encoding scheme or algorithm, such as a RS code, as described in various embodiments herein, or some other encoding scheme known in the art.

According to one embodiment, each of the symbols for the codeword(s) in the encoded data block(s) is 10 bits in size.

In one embodiment, the data set may include 64 sub data sets for a 32 channel system. Each encoded data block may include a smallest amount of data that is recorded to and read from the sequential access medium, such as a CWI-4, a CWI-2, a CWI-1, etc. For example, each sub data set may include four product codewords therein, wherein each row of the sub data set is a CWI-4. In other examples, each sub data set may include two product codewords, wherein each row of the sub data set is a CWI-2, or one product codeword therein, wherein each row of the sub data set is a CWI-1.

In accordance with one embodiment, the plurality of write transducers used to write the data set to the sequential access medium may number at least M, which is the number of tracks or channels written simultaneously. Of course, the magnetic head may comprise more than M write transducers, in various approaches. In one such approach, the magnetic head may include a number of write transducers equaling M for writing data in a forward direction of medium travel, and an additional number of write transducers equaling M for writing data in a reverse direction of medium travel.

In operation 2004, the data set is read, using a plurality of read transducers of the magnetic head, immediately after being written to the sequential access medium in a read-while-write process to identify one or more faulty encoded data blocks. Each of the one or more faulty encoded data blocks includes at least one faulty codeword. By immediately read, what is meant is that the encoded data first written to the sequential access medium is read as soon as is physically possible to be read, in a read-while-write process, based on the layout of the sequential access medium and the design of the storage device (e.g., where the read and write transducers are physically located on the magnetic head, read and write speeds, etc.).

A faulty codeword, and thus a faulty encoded data block that includes the faulty codeword, is determined based on a number of errors included therein, as determined from decoding the data set (or some subset thereof, such as an encoded data block) after reading it from the sequential access medium in the read-while-write process. As described in more detail herein, in response to the number of errors in a codeword or encoded data block equaling or exceeding a threshold, the codeword or encoded data block is determined to be faulty, which triggers a rewrite of the encoded data block, all of the data set, or some smaller subset thereof, to the rewrite area of the sequential access medium.

Each read transducer is configured to read data from a sequential access medium after being written thereto by a corresponding write transducer, in a read-while-write process. A controller and logic integrated with and/or executable by the controller is also included to control operation of the magnetic head and movement of the sequential access medium across the magnetic head. Each read transducer is aligned with a corresponding write transducer configured to store data to one track of the medium to enable read-while-write processing of the just-stored data. In other words, the output of a read transducer is produced during read-while-write.

In accordance with one embodiment, the plurality of read transducers used to read the data set immediately after being written to the sequential access medium may number at least M, which is the number of tracks or channels written simultaneously during read-while-write processing. Of course, the magnetic head may comprise more than M read transducers, in various approaches. In one such approach, the magnetic head may include a number of read transducers equaling M for reading data written in a forward direction of medium travel, and an additional number of read transducers for reading servo tracks/channels that guide the medium movement.

In operation 2006, a particular logical track is selected from a predetermined subset of logical tracks in the rewrite area of the sequential access medium. This particular track will be used to rewrite a subset of the data set (e.g., at least one faulty encoded data block) in response to identifying the one or more faulty encoded data blocks.

The predetermined subset of logical tracks includes D1+D2+1 logical tracks, with 0<D1+D2<M/4. D1 is a non-negative integer value equal to at least zero, and D2 is a non-negative integer value equal to at least zero, with D1+D2>0. As previously described, M is the number of write transducers used to simultaneously write the data set to M tracks of the sequential access medium. Therefore, the subset of logical tracks includes less than one fourth of the number of simultaneously written tracks of the medium, M.

A flexible rewrite table may be utilized to determine the predetermined subset of logical tracks which may have data rewritten thereon taking into consideration specific parameters for the storage device and sequential access medium, e.g., M, S, R, D1, D2, etc.

According to several embodiments, the predetermined subset of logical tracks in the rewrite area may include two logical tracks, three logical tracks, four logical tracks, five logical tracks, or more.

This predetermined subset of logical tracks is selected to include a base logical track on which the rewritten data would have been originally set to be rewritten in the rewrite area according to a conventional rewrite scheme, along with additional tracks preceding or subsequent to this base logical track in the rewrite area.

In one embodiment, these additional logical tracks are in sequence with the base logical track, e.g., 1, 2, 3 (for a subset of three logical tracks); 31, 32, 33, 34, 35 (for a subset of five logical tracks in a 32 channel architectures); 62, 63, 0 (for a subset of three logical tracks); 62, 63, 0, 1, 2, (for a subset of five logical tracks in a 32 channel architecture taking into account a wrap-around scenario), etc.

The rewrite area is positioned subsequent to a position of the data set first written on the sequential access medium (in a direction of forward movement of the medium).

The selection of which logical track within the predetermined subset to select may be based on one or more considerations, as described in more detail herein. In one embodiment, the selection of the logical track is based on whether another encoded data block (such as a CWI or some other amount of data) in the same sub data set has already been scheduled to be rewritten on a particular logical track in the predetermined subset. If so, then another logical track from a different predetermined subset is selected to rewrite the present encoded data block, keeping in mind cases where a wrap-around condition exists. Moreover, the predetermined subset of logical tracks are in sequence, e.g., tracks 29-31, tracks 0-2, tracks 31, 0, 1, or some other possible combination of logical tracks in sequence across the total predetermined subset of logical tracks available to rewrite data.

In operation 2008, a first of the one or more faulty encoded data blocks is rewritten within a first encoded data block set to the particular logical track in the rewrite area in response to identifying the one or more faulty encoded data blocks and/or codewords. In this way, the faulty portion of the data set (which may include any portion or all of the data set) is rewritten to the sequential access medium to correct errors that were detected during the first writing. Moreover, as the one or more encoded data block sets are rewritten to different logical tracks in the rewrite area, a read-while-write process is performed, which may detect additional faulty encoded data block(s) and/or codeword(s) and trigger another rewrite of some or all of the one or more encoded data block sets.

According to one embodiment, the one or more faulty encoded data blocks within the one or more encoded data block sets may be rewritten to the rewrite area of the sequential access medium as four symbol-interleaved RS(240,228) C1 codewords over a Galois Field GF(256), e.g., with 8-bit symbols for each codeword, known as a CWI-4. In addition, the data set first written to the sequential access medium may also be written as a set of CWI-4s.

In another embodiment, the one or more faulty encoded data blocks within the one or more encoded data block sets may be rewritten to the rewrite area of the sequential access medium as two symbol-interleaved RS(384,364) C1 codewords over a Galois Field GF(1024), e.g., with 10-bit symbols for each codeword, referred to herein as a CWI-2. In addition, the data set first written to the sequential access medium may also be written as a set of CWI-2s.

According to another embodiment, the one or more faulty encoded data blocks within the one or more encoded data block sets may be rewritten to the rewrite area of the sequential access medium as one RS(768,728) C1 codeword over a Galois Field GF(1024), e.g., with 10-bit symbols for the codeword, referred to herein as a CWI-1. In addition, the data set first written to the sequential access medium may also be written as a set of CWI-1s.

In accordance with one embodiment, method 2000 may include selecting a second logical track from the predetermined subset of logical tracks in the rewrite area of the sequential access medium, and then a third, a fourth, etc., until all of the faulty encoded data blocks have a suitable logical track to be rewritten on. Then, a second of the one or more faulty encoded data blocks within the first encoded data block set is rewritten to the second logical track in response to the first of the one or more faulty encoded data blocks being from a different sub data set than the second of the one or more faulty encoded data blocks. If the first of the one or more faulty encoded data blocks is not from a different sub data set than the second of the one or more faulty encoded data blocks, then the second of the one or more faulty encoded data blocks is rewritten to a different encoded data block set in the rewrite area. This procedure is repeated until all of the faulty encoded data blocks are rewritten in the rewrite area.

Figure 21:
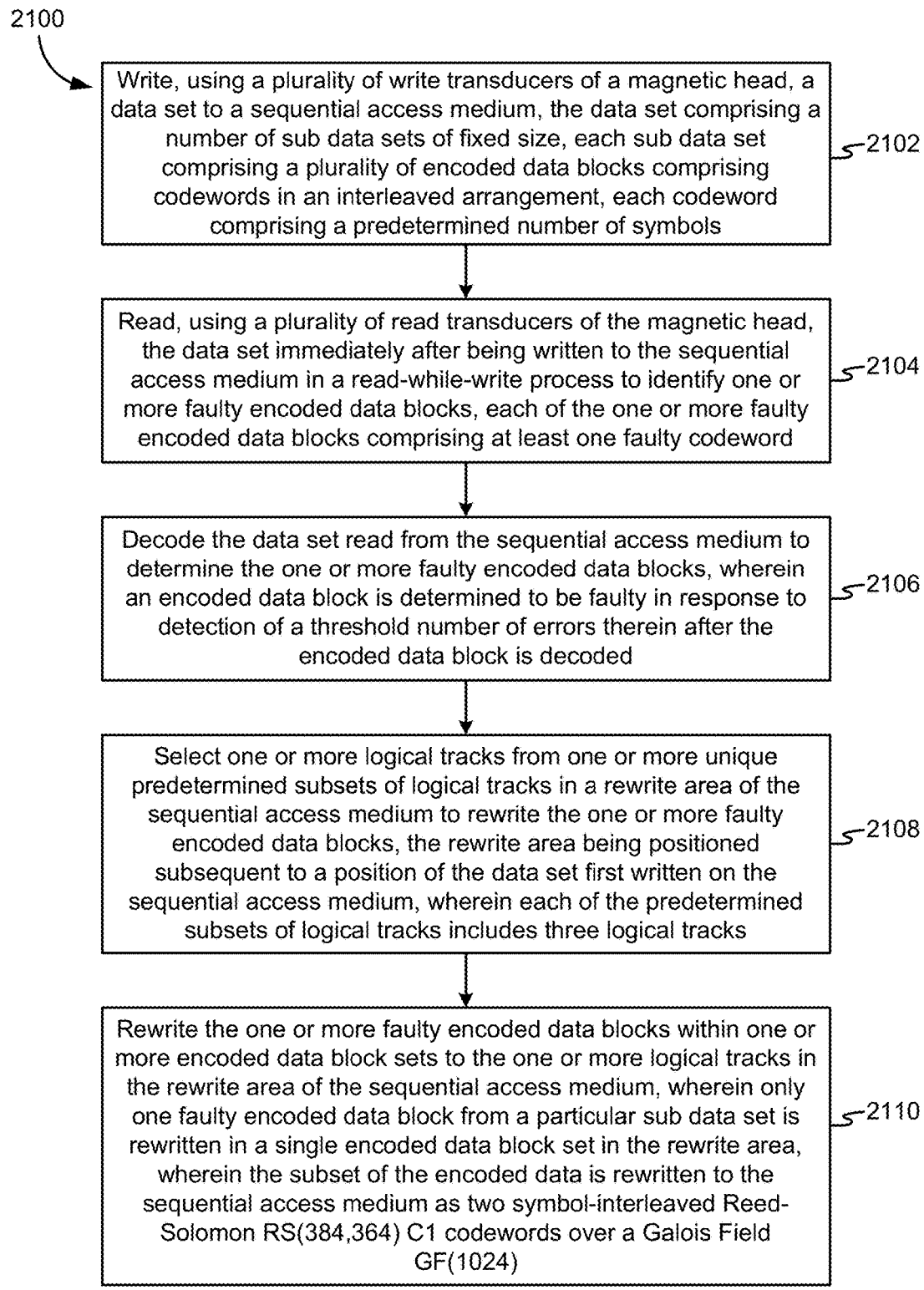
FIG. 21 shows a method according to another embodiment.

Now referring to FIG. 21, a method 2100 is shown for detecting dead tracks from a sequential access medium and/or dead channels in a storage device according to one embodiment. The method 2100 may be performed in accordance with the present invention in any of the environments depicted in FIGS. 1-19, among others, in various embodiments. Of course, more or less operations than those specifically described in FIG. 21 may be included in method 2100, as would be understood by one of skill in the art upon reading the present descriptions.

Each of the steps of the method 2100 may be performed by any suitable component of the operating environment. For example, in various embodiments, the method 2100 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 2100. Illustrative processors include, but are not limited to, a CPU, an ASIC, a FPGA, etc., combinations thereof, or any other suitable computing device known in the art.

As shown in FIG. 21, method 2100 may initiate with operation 2102, where a data set is written, using a plurality of write transducers of a magnetic head of a storage device, to a sequential access medium. The data set includes a number of sub data sets of fixed size, with each sub data set including a plurality of encoded data blocks that each have codewords therein in an interleaved arrangement. Each codeword includes a predetermined number of symbols. Each symbol is 10 bits in size. The data is encoded as two symbol-interleaved RS(384,364) C1 codewords over GF(1024), e.g., two CWI-2s per sub data set.

In operation 2104, the data set is read, using a plurality of read transducers of the magnetic head, immediately after being written to the sequential access medium in a read-while-write process to identify one or more faulty encoded data blocks. Each of the one or more faulty encoded data blocks includes at least one faulty codeword, which is detectable during decoding of the encoded data blocks. By immediately read, what is meant is that the data set first written to the sequential access medium is read as soon as is physically possible to be read, in a read-while-write process, based on the layout of the sequential access medium and the design of the system (e.g., where the read and write transducers are physically located on the magnetic head, read and write speeds, etc.).

A faulty codeword is determined based on a number of errors included therein, as determined from decoding the encoded data block(s) after reading from the sequential access medium in the read-while-write process. As described in more detail herein, in response to the number of errors in a codeword equaling or exceeding a threshold, the codeword is determined to be faulty (and thus the encoded data block which includes the codeword is faulty), which triggers a rewrite of the encoded data block (or some smaller subset or larger portion of the data set, as appropriate according to the rewrite scheme) to the rewrite area of the sequential access medium.

Each read transducer is configured to read data from a sequential access medium after being written thereto by a corresponding write transducer, in a read-while-write process. A controller and logic integrated with and/or executable by the controller is also included to control operation of the magnetic head and movement of the sequential access medium across the magnetic head. Each read transducer is aligned with a corresponding write transducer configured to store data to one track to enable read-while-write processing of the just-stored data. In other words, the output of a read transducer is produced during read-while-write.

In operation 2106, the data set read from the sequential access medium is decoded to determine the one or more faulty encoded data blocks. In this embodiment, an encoded data block and/or codeword is determined to be faulty in response to detection of a threshold number of errors therein, e.g., a threshold that is set to be greater than zero, but less than a maximum number of correctable errors based on the encoding scheme used. In this instance, using a RS(384,364) code over GF(1024), which is able to correct up to 10 errors per codeword, the threshold may be set to be in a range from 1 to 10 for each codeword. Detection of a faulty codeword within an encoded data block results in a determination that the encoded data block is faulty and a rewrite thereof is scheduled as a result.

In operation 2108, one or more logical tracks is selected from within one or more unique predetermined subsets of three logical tracks in the rewrite area of the sequential access medium. These particular logical tracks will be used to rewrite the faulty encoded data block(s) in response to identifying the one or more faulty encoded data blocks. By unique predetermined subsets of three logical tracks, what is meant is that each subset of logical tracks is different in that it includes three logical tracks that are different from any other subset of three logical tracks for any particular combination of SDS number and encoded data block set number. Of course, some logical tracks may appear in multiple subsets. For example, track 5 would appear in three subsets of tracks: 3,4,5; 4,5,6; 5,6,7. However, each of these subsets of logical tracks that include logical track 5 are unique from one another.

A flexible rewrite table may be utilized to determine the predetermined subset of three logical tracks which may have data rewritten thereon taking into consideration specific parameters for the storage device and sequential access medium, e.g., M, S, R, D1, D2, etc.

Each of the subsets of logical tracks is selected to include a base logical track on which the faulty encoded data block(s) would have been originally set to be rewritten in the rewrite area according to a conventional rewrite scheme, along with additional tracks preceding or subsequent to this base logical track in the rewrite area.

The rewrite area is positioned subsequent to a position of the data set first written on the sequential access medium (in a direction of forward movement of the medium).

The selection of which logical track within one of the predetermined subsets of logical tracks to select may be based on one or more considerations, as described in more detail herein. In one embodiment, the selection of the logical track is based on whether another encoded data block (such as a CWI or some other amount of data) in the same sub data set has already been scheduled to be rewritten on a particular logical track in the predetermined subset of logical tracks. If so, then another logical track from a different subset of logical tracks is selected to rewrite the present encoded data block, keeping in mind cases where a wrap-around condition exists. Moreover, in one embodiment, the subset of logical tracks are in sequence, e.g., tracks 29-31, tracks 0-2, tracks 31, 0, 1, or some other possible combination of three logical tracks in sequence across the total set of logical tracks.

In operation 2110, the one or more faulty encoded data blocks that includes the one or more faulty codewords is rewritten to the one or more logical tracks in the rewrite area in response to identifying the one or more faulty encoded data blocks and/or codewords. In this way, the faulty portion of the data set (which may include any portion or all of the data set) is rewritten to the sequential access medium to correct errors that were detected during the first writing. Moreover, as the one or more faulty encoded data blocks is rewritten, a read-while-write process is performed, which may detect additional faulty encoded data block(s) and/or codeword(s) and trigger another rewrite of some or all of the one or more faulty encoded data blocks.

In this embodiment, only one faulty encoded data block from a particular sub data set is rewritten in a single encoded data block set in the rewrite area. To rewrite another faulty encoded data block from the particular sub data set, a different encoded data block set in the rewrite area is used.

Figure 22:
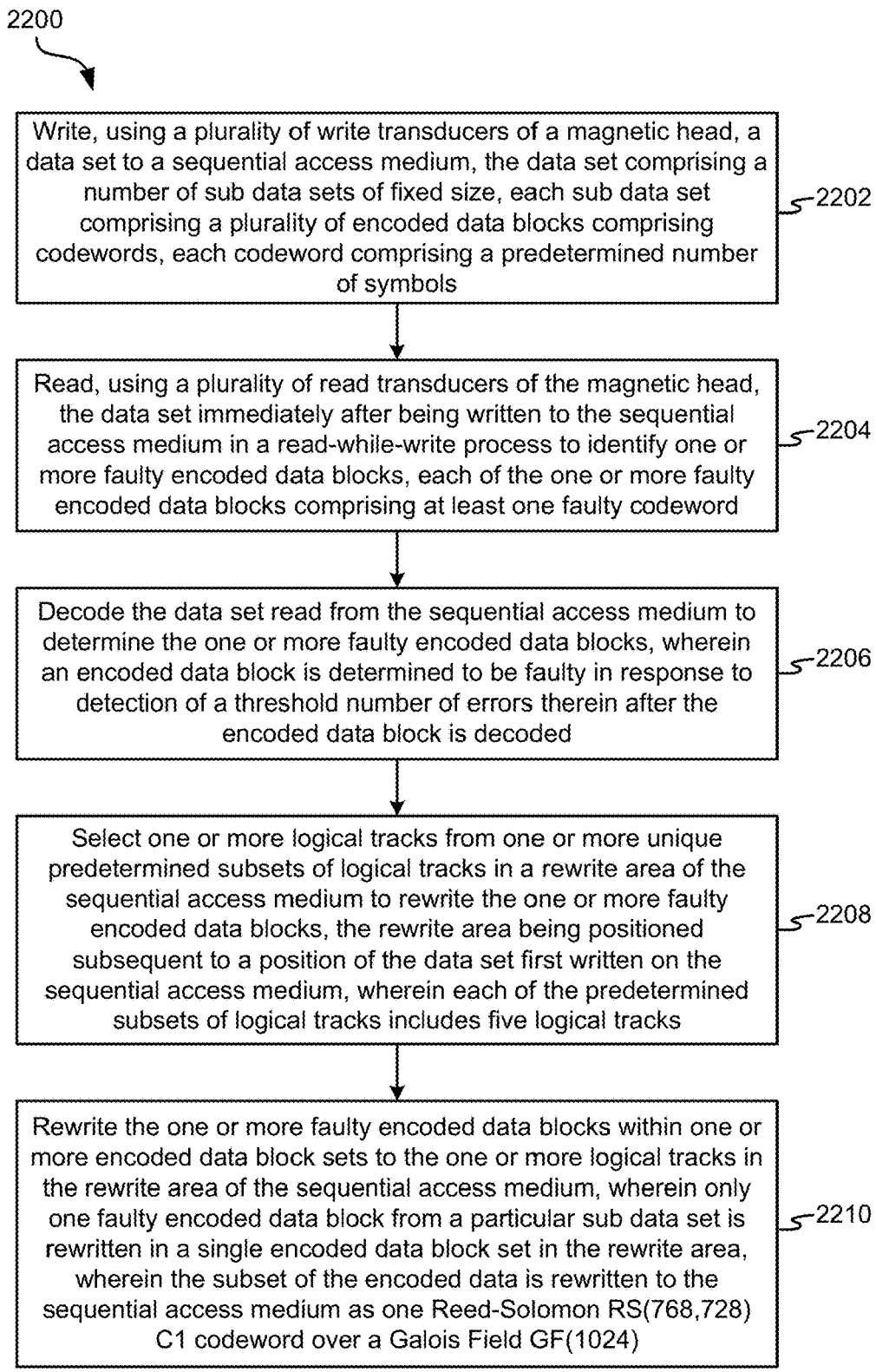
FIG. 22 shows a method according to yet another embodiment.

Now referring to FIG. 22, a method 2200 is shown for detecting dead tracks from a sequential access medium and/or dead channels in a storage device according to one embodiment. The method 2200 may be performed in accordance with the present invention in any of the environments depicted in FIGS. 1-19, among others, in various embodiments. Of course, more or less operations than those specifically described in FIG. 22 may be included in method 2200, as would be understood by one of skill in the art upon reading the present descriptions.

Each of the steps of the method 2200 may be performed by any suitable component of the operating environment. For example, in various embodiments, the method 2200 may be partially or entirely performed by a controller, a processor, a tape drive, an optical drive, or some other device having one or more processors therein. The processor, e.g., processing circuit(s), chip(s), and/or module(s) implemented in hardware and/or software, and preferably having at least one hardware component, may be utilized in any device to perform one or more steps of the method 2200. Illustrative processors include, but are not limited to, a CPU, an ASIC, a FPGA, etc., combinations thereof, or any other suitable computing device known in the art.

As shown in FIG. 22, method 2200 may initiate with operation 2202, where a data set is written, using a plurality of write transducers of a magnetic head of a storage device, to a sequential access medium. The data set includes a number of sub data sets of fixed size. Each of the sub data sets includes a plurality of encoded data blocks, with each encoded data block having codewords in a non-interleaved arrangement. Each codeword includes a predetermined number of symbols, and each symbol is 10 bits in size. The data is encoded as one RS(768,728) C1 codeword over GF(1024), e.g., one CWI-1 per sub data set.

In operation 2204, the data set is read, using a plurality of read transducers of the magnetic head, immediately after being written to the sequential access medium in a read-while-write process to identify one or more faulty encoded data blocks. Each of the one or more faulty encoded data blocks includes at least one faulty codeword. By immediately read, what is meant is that the data set first written to the sequential access medium is read as soon as is physically possible to be read, in a read-while-write process, based on the layout of the sequential access medium and the design of the storage device (e.g., where the read and write transducers are physically located on the magnetic head, read and write speeds, etc.).

A faulty codeword, and thus a faulty encoded data block that includes the faulty codeword, is determined based on a number of errors included therein, as determined from decoding the data set or a portion thereof after reading it from the sequential access medium in the read-while-write process. As described in more detail herein, in response to the number of errors in a codeword or encoded data block equaling or exceeding a threshold, the codeword or encoded data block is determined to be faulty, which triggers a rewrite of the encoded data block (or some smaller subset thereof or larger portion of the data set) to a rewrite area of the sequential access medium.

Each read transducer is configured to read data from a sequential access medium after being written thereto by a corresponding write transducer, in a read-while-write process. A controller and logic integrated with and/or executable by the controller is also included to control operation of the magnetic head and movement of the sequential access medium across the magnetic head. Each read transducer is aligned with a corresponding write transducer configured to store data to one track of the medium to enable read-while-write processing of the just-stored data. In other words, the output of a read transducer is produced during read-while-write.

In operation 2206, the data set read from the sequential access medium is decoded to determine the one or more faulty codewords and/or encoded data blocks. In this embodiment, an encoded data block and/or a codeword is determined to be faulty in response to detection of a threshold number of errors therein, e.g., a threshold that is set to be greater than zero, but less than a maximum number of correctable errors based on the encoding scheme used. In this instance, using a RS(768,728) code over GF(1024), which is able to correct up to 20 errors per codeword, the threshold may be set to be in a range from 1 to 20 for each codeword. Detection of a faulty codeword within an encoded data block results in a determination that the encoded data block is faulty and a rewrite thereof is scheduled as a result.

In operation 2208, one or more logical tracks is selected from within one or more unique predetermined subsets of five logical tracks in the rewrite area of the sequential access medium. These particular logical track(s) will be used to rewrite the faulty encoded data block(s) in response to identifying the one or more faulty encoded data blocks. By unique predetermined subsets of five logical tracks, what is meant is that each subset of logical tracks is different in that it includes five logical tracks that are different from any other subset of five logical tracks for any particular combination of SDS number and encoded data block set number. Of course, some logical tracks may appear in multiple subsets. For example, track 5 would appear in five subsets of tracks: 1,2,3,4,5; 2,3,4,5,6; 3,4,5,6,7; 4,5,6,7,8; 5,6,7,8,9. However, each of these subsets of logical tracks that include logical track 5 are unique from one another.

A flexible rewrite table may be utilized to determine the predetermined subset of five logical tracks which may have data rewritten thereon taking into consideration specific parameters for the storage device and sequential access medium, e.g., M, S, R, D1, D2, etc.

Each of the subsets of logical tracks is selected to include a base logical track on which the faulty encoded data block(s) would have been originally set to be rewritten in the rewrite area according to a conventional rewrite scheme, along with additional tracks preceding or subsequent to this base logical track in the rewrite area.

The rewrite area is positioned subsequent to a position of the data set first written on the sequential access medium (in a direction of forward movement of the medium).

The selection of which logical track within one of the predetermined subsets of logical tracks to select may be based on one or more considerations, as described in more detail herein. In one embodiment, the selection of the logical track is based on whether another encoded data block (such as a CWI or some other amount of data) in the same sub data set has already been scheduled to be rewritten on a particular logical track in the predetermined subset of logical tracks. If so, then another logical track from a different predetermined subset of logical tracks is selected to rewrite the present encoded data block, keeping in mind cases where a wrap-around condition exists. Moreover, the subset of logical tracks are in sequence, e.g., tracks 29-33, tracks 0-4, tracks 31, 0, 1, 2, 3, or some other possible combination of five logical tracks in sequence across the total set of logical tracks.

In operation 2210, the one or more faulty encoded data blocks that includes the one or more faulty codewords is rewritten to the one or more logical tracks in the rewrite area in response to identifying the one or more faulty encoded data blocks and/or codewords. In this way, the faulty portion of the data set (which may include any portion or all of the data set) is rewritten to the sequential access medium to correct errors that were detected during the first writing. Moreover, as the one or more faulty encoded data blocks is rewritten, a read-while-write process is performed, which may detect additional faulty encoded data block(s) and/or codeword(s) and trigger another rewrite of some or all of the one or more faulty encoded data blocks.

In this embodiment, only one faulty encoded data block from a particular sub data set is rewritten in a single encoded data block set in the rewrite area. To rewrite another faulty encoded data block from the particular sub data set, a different encoded data block set in the rewrite area is used.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an ASIC, a FPGA, etc. By executable by the processor, what is meant is that the logic is hardware logic, software logic such as firmware, part of an operating system, part of an application program, etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a CPU, an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation.

Thus, the breadth and scope of a preferred embodiment should not be limited by any of the above-described exemplary embodiments, but should be defined only in accordance with the following claims and their equivalents.

What is claimed is:

1. A system, comprising:
  a magnetic head having a plurality of write transducers numbering at least M and a plurality of read transducers numbering at least M, each read transducer being configured to read data from a sequential access medium after being written thereto by a corresponding write transducer; and
  a controller and logic integrated with and/or executable by the controller, the logic being configured to:
    write, using the plurality of M write transducers, a data set to a sequential access medium, the data set comprising a number of sub data sets of fixed size, each sub data set comprising a plurality of encoded data blocks comprising codewords in an interleaved or non-interleaved arrangement, each codeword comprising a predetermined number of symbols having a size of at least 8 bits for each symbol;
    read, using the plurality of M read transducers, the data set immediately after being written to the sequential access medium in a read-while-write process to identify one or more faulty encoded data blocks, each of the one or more faulty encoded data blocks comprising at least one faulty codeword;
    select a particular logical track from a predetermined subset of logical tracks in a rewrite area of the sequential access medium to rewrite the faulty encoded data blocks, the rewrite area being positioned subsequent to a position of the data set first written on the sequential access medium, wherein the predetermined subset of logical tracks includes D1+D2+1 logical tracks, and wherein 0<D1+D2<M/4; and
    rewrite a first of the one or more faulty encoded data blocks within a first encoded data block set to the particular logical track in the rewrite area of the sequential access medium, wherein only one faulty encoded data block from a particular sub data set is rewritten in a single encoded data block set in the rewrite area.

2. The system as recited in claim 1, wherein each of the symbols are 10 bits in size, and wherein the logic is further configured to:
  select a second logical track from the predetermined subset of logical tracks in the rewrite area of the sequential access medium; and
  rewrite a second of the one or more faulty encoded data blocks within the first encoded data block set to the second logical track in response to the first of the one or more faulty encoded data blocks being from a different sub data set than the second of the one or more faulty encoded data blocks.

3. The system as recited in claim 1, wherein each of the predetermined subsets of logical tracks comprises three logical tracks in sequence corresponding to D1=1 and D2=1.

4. The system as recited in claim 1, wherein each of the predetermined subsets of logical tracks comprises five logical tracks in sequence corresponding to D1=2 and D2=2.

5. The system as recited in claim 1, wherein each encoded data block is written to the sequential access medium as four symbol-interleaved Reed-Solomon RS(240,228) C1 codewords over a Galois Field GF(256).

6. The system as recited in claim 1, wherein each encoded data block is written to the sequential access medium as two symbol-interleaved Reed-Solomon RS(384,364) C1 codewords over a Galois Field GF(1024).

7. The system as recited in claim 1, wherein each encoded data block is written to the sequential access medium as one Reed-Solomon RS(768,728) C1 codeword over a Galois Field GF(1024).

8. The system as recited in claim 1, wherein the logic is further configured to decode the data set read from the sequential access medium to determine the one or more faulty encoded data blocks, wherein an encoded data block is determined to be faulty in response to detection of a threshold number of errors therein after the encoded data block is decoded.

9. A method, comprising:
  writing, using a plurality of at least M write transducers of a magnetic head, a data set to a sequential access medium, the data set comprising a number of sub data sets of fixed size, each sub data set comprising a plurality of encoded data blocks comprising codewords in an interleaved or non-interleaved arrangement, each codeword comprising a predetermined number of symbols having a size of at least 8 bits for each symbol;
  reading, using a plurality of at least M read transducers of the magnetic head, the data set immediately after being written to the sequential access medium in a read-while-write process to identify one or more faulty encoded data blocks, each of the one or more faulty encoded data blocks comprising at least one faulty codeword;
selecting a particular logical track from a predetermined subset of logical tracks in a rewrite area of the sequential access medium to rewrite the faulty encoded data blocks, the rewrite area being positioned subsequent to a position of the data set first written on the sequential access medium, wherein the predetermined subset of logical tracks includes D1+D2+1 logical tracks, and wherein 0<D1+D2<M/4; and
rewriting a first of the one or more faulty encoded data blocks within a first encoded data block set to the particular logical track in the rewrite area of the sequential access medium, wherein only one faulty encoded data block from a particular sub data set is rewritten in a single encoded data block set in the rewrite area.

10. The method as recited in claim 9, wherein each of the symbols are 10 bits in size, the method further comprising:
selecting a second logical track from the predetermined subset of logical tracks in the rewrite area of the sequential access medium; and
rewriting a second of the one or more faulty encoded data blocks within the first encoded data block set to the second logical track in response to the first of the one or more faulty encoded data blocks being from a different sub data set than the second of the one or more faulty encoded data blocks.

11. The method as recited in claim 9, wherein each of the predetermined subsets of logical tracks comprises three logical tracks in sequence corresponding to D1=1 and D2=1.

12. The method as recited in claim 9, wherein each of the predetermined subsets of logical tracks comprises five logical tracks in sequence corresponding to D1=2 and D2=2.

13. The method as recited in claim 9, wherein each encoded data block is written to the sequential access medium as four symbol-interleaved Reed-Solomon RS(240, 228) C1 codewords over a Galois Field GF(256).

14. The method as recited in claim 9, wherein each encoded data block is written to the sequential access medium as two symbol-interleaved Reed-Solomon RS(384, 364) C1 codewords over a Galois Field GF(1024).

15. The method as recited in claim 9, wherein each encoded data block is written to the sequential access medium as one Reed-Solomon RS(768,728) C1 codeword over a Galois Field GF(1024).

16. The method as recited in claim 9, further comprising decoding the data set read from the sequential access medium to determine the one or more faulty encoded data blocks, wherein an encoded data block is determined to be faulty in response to detection of a threshold number of errors therein after the encoded data block is decoded.

17. A computer program product, the computer program product comprising a computer readable storage medium having program instructions embodied therewith, the embodied program instructions being executable by a processor to cause the processor to:
write, by the processor using a plurality of at least M write transducers of a magnetic head, a data set to a sequential access medium, the data set comprising a number of sub data sets of fixed size, each sub data set comprising a plurality of encoded data blocks comprising codewords in an interleaved or non-interleaved arrangement, each codeword comprising a predetermined number of symbols having a size of at least 8 bits for each symbol;
read, by the processor using a plurality of at least M read transducers of the magnetic head, the data set immediately after being written to the sequential access medium in a read-while-write process to identify one or more faulty encoded data blocks, each of the one or more faulty encoded data blocks comprising at least one faulty codeword;
select, by the processor, a particular logical track from a predetermined subset of logical tracks in a rewrite area of the sequential access medium to rewrite the faulty encoded data blocks, the rewrite area being positioned subsequent to a position of the data set first written on the sequential access medium, wherein the predetermined subset of logical tracks includes D1+D2+1 logical tracks, and wherein 0<D1+D2<M/4; and
rewrite, by the processor, a first of the one or more faulty encoded data blocks within a first encoded data block set to the particular logical track in the rewrite area of the sequential access medium, wherein only one faulty encoded data block from a particular sub data set is rewritten in a single encoded data block set in the rewrite area.

18. The computer program product as recited in claim 17, wherein each of the symbols are 8 bits in size, and wherein each encoded data block is written to the sequential access medium as four symbol-interleaved Reed-Solomon RS(240, 228) C1 codewords over a Galois Field GF(256).

19. The computer program product as recited in claim 17, wherein each of the symbols are 10 bits in size, and wherein each encoded data block is written to the sequential access medium as two symbol-interleaved Reed-Solomon RS(384, 364) C1 codewords over a Galois Field GF(1024).

20. The computer program product as recited in claim 17, wherein each of the symbols are 10 bits in size, and wherein each encoded data block is written to the sequential access medium as one Reed-Solomon RS(768,728) C1 codeword over a Galois Field GF(1024).

21. The computer program product as recited in claim 17, wherein each of the predetermined subsets of logical tracks comprise three logical tracks in sequence corresponding to D1=1 and D2=1.

22. The computer program product as recited in claim 17, wherein each of the predetermined subsets of logical tracks comprise five logical tracks in sequence corresponding to D1=2 and D2=2.

23. The computer program product as recited in claim 17, wherein the embodied program instructions are further executable by the processor to cause the processor to:
decode, by the processor, the data set read from the sequential access medium to determine the one or more faulty encoded data blocks, wherein an encoded data block is determined to be faulty in response to detection of a threshold number of errors therein after the encoded data block is decoded;
select, by the processor, a second logical track from the predetermined subset of logical tracks in the rewrite area of the sequential access medium; and
rewrite, by the processor, a second of the one or more faulty encoded data blocks within the first encoded data block set to the second logical track in response to the first of the one or more faulty encoded data blocks being from a different sub data set than the second of the one or more faulty encoded data blocks.

24. A method, comprising:
writing, using a plurality of write transducers of a magnetic head, a data set to a sequential access medium, the data set comprising a number of sub data sets of fixed size, each sub data set comprising a plurality of encoded data blocks comprising codewords in an interleaved arrangement, each codeword comprising a predetermined number of symbols;

reading, using a plurality of read transducers of the magnetic head, the data set immediately after being written to the sequential access medium in a read-while-write process to identify one or more faulty encoded data blocks, each of the one or more faulty encoded data blocks comprising at least one faulty codeword;

decoding the data set read from the sequential access medium to determine the one or more faulty encoded data blocks, wherein an encoded data block is determined to be faulty in response to detection of a threshold number of errors therein after the encoded data block is decoded;

selecting one or more logical tracks from one or more unique predetermined subsets of logical tracks in a rewrite area of the sequential access medium to rewrite the one or more faulty encoded data blocks, the rewrite area being positioned subsequent to a position of the data set first written on the sequential access medium, wherein each of the predetermined subsets of logical tracks includes three logical tracks; and rewriting the one or more faulty encoded data blocks within one or more encoded data block sets to the one or more logical tracks in the rewrite area of the sequential access medium, wherein only one faulty encoded data block from a particular sub data set is rewritten in a single encoded data block set in the rewrite area, wherein each encoded data block is written to the sequential access medium as two symbol-interleaved Reed-Solomon RS(384,364) C1 codewords over a Galois Field GF(1024).

25. A method, comprising:

writing, using a plurality of write transducers of a magnetic head, a data set to a sequential access medium, the data set comprising a number of sub data sets of fixed size, each sub data set comprising a plurality of encoded data blocks comprising codewords, each codeword comprising a predetermined number of symbols;

reading, using a plurality of read transducers of the magnetic head, the data set immediately after being written to the sequential access medium in a read-while-write process to identify one or more faulty encoded data blocks, each of the one or more faulty encoded data blocks comprising at least one faulty codeword;

decoding the data set read from the sequential access medium to determine the one or more faulty encoded data blocks, wherein an encoded data block is determined to be faulty in response to detection of a threshold number of errors therein after the encoded data block is decoded;

selecting one or more logical tracks from one or more unique predetermined subsets of logical tracks in a rewrite area of the sequential access medium to rewrite the one or more faulty encoded data blocks, the rewrite area being positioned subsequent to a position of the data set first written on the sequential access medium, wherein each of the predetermined subsets of logical tracks includes five logical tracks; and rewriting the one or more faulty encoded data blocks within one or more encoded data block sets to the one or more logical tracks in the rewrite area of the sequential access medium, wherein only one faulty encoded data block from a particular sub data set is rewritten in a single encoded data block set in the rewrite area, wherein each encoded data block is written to the sequential access medium as one Reed-Solomon RS(768,728) C1 codeword over a Galois Field GF(1024).

* * * * *